(12) United States Patent  
Ikeda et al.

(10) Patent No.: US 8,293,319 B2  
(45) Date of Patent: Oct. 23, 2012

(54) METHOD FOR MANUFACTURING LIGHT-EMITTING DEVICE

(75) Inventors: Hisao Ikeda, Kanagawa (JP); Takahiro Ibe, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 393 days.

(21) Appl. No.: 12/429,314

(22) Filed: Apr. 24, 2009

(65) Prior Publication Data

US 2009/0269485 A1 Oct. 29, 2009

(30) Foreign Application Priority Data

Apr. 25, 2008 (JP) ................................. 2008-114975

(51) Int. Cl.
*B05D 5/06* (2006.01)

(52) U.S. Cl. .......... 427/66; 427/146; 427/595; 427/596; 438/29; 438/22; 438/587

(58) Field of Classification Search .................. None
See application file for complete search history.

(56) References Cited

U.S. PATENT DOCUMENTS

| | | | |
|---|---|---|---|
| 4,923,860 A | 5/1990 | Simons | |
| 5,851,709 A * | 12/1998 | Grande et al. | ............... 430/7 |
| 5,937,272 A | 8/1999 | Tang | |
| 5,994,028 A | 11/1999 | Lee | |
| 6,165,543 A | 12/2000 | Otsuki et al. | |
| 6,283,060 B1 | 9/2001 | Yamazaki et al. | |
| 6,284,307 B1 | 9/2001 | Fukuzawa et al. | |
| 6,555,284 B1 | 4/2003 | Boroson et al. | |
| 6,689,492 B1 | 2/2004 | Yamazaki et al. | |
| 6,703,179 B2 | 3/2004 | Tyan | |
| 6,776,847 B2 | 8/2004 | Yamazaki et al. | |
| 7,316,983 B2 | 1/2008 | Yamazaki et al. | |
| 7,674,749 B2 | 3/2010 | Kang et al. | |
| 7,932,112 B2 | 4/2011 | Yokoyama et al. | |
| 7,993,945 B2 | 8/2011 | Ikeda et al. | |
| 2004/0065902 A1 | 4/2004 | Yamazaki et al. | |
| 2005/0005848 A1 | 1/2005 | Yamazaki et al. | |
| 2005/0145326 A1 | 7/2005 | Hatwar | |
| 2006/0084006 A1 | 4/2006 | Kang et al. | |
| 2006/0243377 A1 | 11/2006 | Matsuo et al. | |

(Continued)

FOREIGN PATENT DOCUMENTS

| | | |
|---|---|---|
| JP | 2000-256877 | 9/2000 |
| JP | 2003-313654 | 11/2003 |
| JP | 2004-103406 | 4/2004 |
| JP | 2006-309995 | 11/2006 |
| JP | 2006-344459 | 12/2006 |
| WO | WO 2005/069398 A2 | 7/2005 |

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

*Primary Examiner* — Monica A Huson  
(74) *Attorney, Agent, or Firm* — Husch Blackwell LLP

(57) ABSTRACT

By irradiating a first substrate which is an evaporation donor substrate including a function layer in which films having different refractive indexes (high-refractive index films and low refractive index films) are stacked with first light (wavelength=$\lambda_1$), a material layer over the first substrate is patterned, and by irradiating the first substrate with second light (wavelength=$\lambda_2$) which is different from $\lambda_1$, the material layer which is patterned is evaporated onto a second substrate which is a deposition target substrate.

8 Claims, 14 Drawing Sheets

U.S. PATENT DOCUMENTS

| | | |
|---|---|---|
| 2006/0246240 A1 | 11/2006 | Matsuda et al. |
| 2007/0267953 A1* | 11/2007 | Seki .............................. 313/292 |
| 2007/0287093 A1* | 12/2007 | Jing et al. ................... 430/270.1 |
| 2008/0081115 A1 | 4/2008 | Yamazaki et al. |
| 2008/0299496 A1 | 12/2008 | Hirakata et al. |
| 2009/0075214 A1 | 3/2009 | Hirakata et al. |
| 2009/0104403 A1 | 4/2009 | Aoyama et al. |
| 2009/0104835 A1 | 4/2009 | Aoyama et al. |
| 2009/0197017 A1 | 8/2009 | Tanaka et al. |

* cited by examiner

METHOD FOR MANUFACTURING LIGHT-EMITTING DEVICE

BACKGROUND OF THE INVENTION

1. Field of the Invention

The present invention relates to a method for manufacturing a light-emitting device using an evaporation method.

2. Description of the Related Art

Light-emitting elements, which use organic compounds as a light emitter and are characterized by the thinness, light-weight, fast response, and direct current low voltage driving, are expected to be applied to next-generation flat panel displays. In particular, display devices in which light-emitting elements are arranged in matrix have been considered to be superior to conventional liquid crystal display devices in terms of a wide viewing angle and excellent visibility.

It is considered that a light emission mechanism of a light-emitting element is as follows: when voltage is applied between a pair of electrodes which interpose an EL layer, electrons injected from a cathode and holes injected from an anode are recombined in the light emission center of the EL layer to form a molecular exciton, and when the molecular exciton relaxes to the ground state, energy is released to emit light. As the excited state, a singlet excited state and a triplet excited state are known, and it is considered that light emission can be obtained through either of the excited states.

An EL layer included in a light-emitting element includes at least a light-emitting layer. In addition, the EL layer can have a stacked-layer structure including a hole-injecting layer, a hole-transporting layer, an electron-transporting layer, an electron-injecting layer, and/or the like, in addition to the light-emitting layer.

In addition, an EL material for forming an EL layer is broadly classified into a low molecular (monomer) material and a high molecular (polymer) material. In general, a film of a low molecular material is often formed by an evaporation method and a film of a high molecular material is often formed by an inkjet method or the like.

An evaporation apparatus which is used in an evaporation method has a substrate holder to which a substrate is mounted; a crucible (or an evaporation boat) containing an EL material, that is, an evaporation material; a heater for heating the EL material in the crucible; and a shutter for preventing the EL material from being scattered during sublimation. The EL material which is heated by the heater is sublimated and deposited onto the substrate.

Note that in order to achieve uniform deposition, actually, a deposition target substrate needs to be rotated and the substrate and the crucible need to be separated from each other by at least a certain distance. In addition, when films of different colors are separately formed using a plurality of EL materials through a mask such as a metal mask, it is necessary that the distance between pixels be designed to be large and that the width of a partition (bank) formed of an insulator between pixels be large. Such needs are major problems in advancing high definition (increasing the number of pixels) and miniaturization of pixel pitches along with downsize of a light-emitting device including a light-emitting element.

Therefore, as for flat panel displays, it has been necessary to solve those problems as well as to achieve high productivity and cost reduction in order to achieve higher definition and higher reliability.

Thus, a method for forming an EL layer of a light-emitting element through laser thermal transfer has been proposed (see Reference 1: Japanese Published Patent Application No. 2006-309995). Reference 1 discloses a transfer substrate which has a photothermal conversion layer including a low-reflective layer and a high-reflective layer and also a transfer layer over a supporting substrate. Irradiation of such a transfer substrate with laser light allows the transfer layer to be transferred to an element-forming substrate.

SUMMARY OF THE INVENTION

However, as in Patent Document 1, in the case where a transfer substrate in which a transfer layer is formed over a high-reflective layer and a low-reflective layer is irradiated with laser light and the transfer layer is directly transferred to a deposition target substrate, if irradiation time with laser light is long, heat generated in the low-reflective layer is highly likely to be conducted to the high-reflective layer, whereby not only the transfer layer over the low-reflective layer but also the transfer layer over the high-reflective layer is highly likely to be transferred. On the other hand, if the transfer substrate is instantaneously irradiated with laser light having high output power for shortening irradiation time with laser light, although only the transfer layer over the low-reflective layer is transferred and a desired evaporation patterning can be formed, a material which forms the transfer layer is likely to be decomposed or deteriorated because the transfer layer reaches high temperature at the moment of irradiation with laser light. Further, a transferred film formed as described above is highly likely to be highly uneven and have low film quality.

Then, an embodiment of the present invention is to provide a method for manufacturing a light-emitting device with high definition, high light-emitting characteristics, and a long lifetime by using a method with which a material layer which is to be a transfer layer is prevented from being evaporated beyond necessity, a desired evaporation pattern can be formed, and deterioration of a material or the like is hardly caused in performing transfer.

An embodiment of the present invention is a method for manufacturing a light-emitting device including the steps of: irradiating a first substrate which is an evaporation donor substrate having a function layer in which films having different refractive indexes (high-refractive index films and low-refractive index films) are stacked with first light (wavelength=$\lambda_1$) to pattern a material layer over the first substrate; and irradiating the first substrate with second light (wavelength=$\lambda_2$) to evaporate the material layer which is patterned onto the second substrate which is a deposition target substrate.

An embodiment of the present invention is a method for manufacturing a light-emitting device including the steps of: forming a function layer having opening portions on one surface of a first substrate; forming a light-absorbing layer in contact with the first substrate and the function layer; forming a material layer in contact with the light-absorbing layer; performing irradiation with laser light having a first wavelength ($\lambda_1$) from the other surface of the first substrate to remove a portion which is a part of the material layer and overlaps with the opening portions of the function layer; placing the one surface of the first substrate and a deposition target surface of a second substrate close to each other to face each other; and performing irradiation with light having a second wavelength ($\lambda_2$) which is different from the first wavelength from the other surface side of the first substrate to evaporate a part of the material layer which overlaps with the function layer onto the deposition target surface of the second substrate.

In the above structure, the first wavelength ($\lambda_1$) and the second wavelength ($\lambda_2$) satisfy the following formula (1).

$$\lambda_2 > 1.4\lambda_1 \text{ or } \lambda_2 < 0.8\lambda_1, \text{ and } \lambda_2 \neq \lambda_1(2n+1) \text{ ($n$ is a natural number)} \quad (1)$$

In the above structure, two or more first function films having a high-refractive index and two or more second function films having a low-refractive index are alternately stacked in the function layer; the refractive index of the first function films is defined as $n_1$ and the refractive index of the second function films is defined as $n_2$; and the thickness ($x_1$) of each of the first function films is $$0.9 \times (\lambda_1/4n_1) \leq x_1 \leq 1.1 \times (\lambda_1/4n_1),$$

and the thickness ($x_2$) of each of the second function films is $$0.9 \times (\lambda_1/4n_2) \leq x_2 \leq 1.1 \times (\lambda_1/4n_2).$$

In the above structure, the refractive index of the first function films ($n_1$) is greater than or equal to 2.0 and less than or equal to 3.0, and the refractive index of the second function films ($n_2$) is greater than or equal to 1.2 and less than or equal to 1.7.

In the above structure, the first function films are formed with titanium oxide or zinc oxide, and the second function films are formed with silicon oxide or magnesium fluoride.

In the above structure, the function layer has a reflectance of greater than or equal to 70% with respect to light having a wavelength $\lambda_1$.

In the above structure, the light-absorbing layer has a reflectance of less than or equal to 70% with respect to light, and includes any of tantalum nitride, titanium nitride, chromium nitride, manganese nitride, titanium, and carbon.

In the above structure, the material layer is formed with an organic compound, and includes one or both of a light-emitting material and a carrier-transporting material.

The present invention includes, in its category, an electronic device including a light-emitting device as well as a light-emitting device including a light-emitting element. Accordingly, a light-emitting device in this specification includes an image display device, a light-emitting device, and a light source (including a lighting device). In addition, the light-emitting device includes all of the following modules: modules in which a connector such as an FPC (flexible printed circuit), a TAB (tape automated bonding) tape, or a TCP (tape carrier package) is attached to a light-emitting device; modules having a TAB tape or a TCP provided with a printed wiring board at the end thereof; and modules having an IC (integrated circuit) directly mounted on a light-emitting element by a COG (chip on glass) method.

In a method for manufacturing a light-emitting device according to an embodiment of the present invention, a material layer over an evaporation donor substrate can be patterned and can be deposited onto a deposition target substrate by performing light irradiation twice. Specifically, the material layer formed over the evaporation donor substrate is patterned by first light irradiation, and the material layer which is patterned is evaporated onto the deposition target substrate by second light irradiation; thus, the material layer can be evaporated with high accuracy, and a light-emitting device with high definition, high light-emitting characteristics, and a long lifetime can be manufactured.

Note that, in the first light irradiation, by using laser light having a wavelength ($\lambda_1$) which is reflected by the function layer, high light intensity can be instantaneously given to a desired position; thus, a pattern with high accuracy can be formed. Further, in the second light irradiation, by using light having a wavelength ($\lambda_2$) which is transmitted through the function layer, the material layer which is patterned at a position overlapping with the function layer can be efficiently evaporated onto the deposition target substrate.

Note that, in the second light irradiation, in the case where a lamp is used as a light source, deposition can be performed on a large area at a time; thus, productivity of the light-emitting device can be improved. Further, in an embodiment of the present invention, by directly or indirectly heating the evaporation donor substrate instead of the second light irradiation, an evaporation material over the evaporation donor substrate can be sublimated and deposited onto the deposition target substrate.

DETAILED DESCRIPTION OF THE INVENTION

Hereinafter, embodiments of the present invention will be described in detail with reference to the drawings. However, the present invention is not limited to explanation to be given below, and it is to be easily understood that modes and details thereof can be variously modified without departing from the purpose and the scope of the present invention. Therefore, the present invention should not be interpreted as being limited to what is described in the embodiments described below.

(Embodiment 1)

In Embodiment 1, a deposition method using an evaporation donor substrate according to an embodiment of the present invention is described. Note that the case where an EL layer of a light-emitting element is formed using an evaporation donor substrate over which an evaporation material is patterned will be described in Embodiment 1.

Figure 1A:
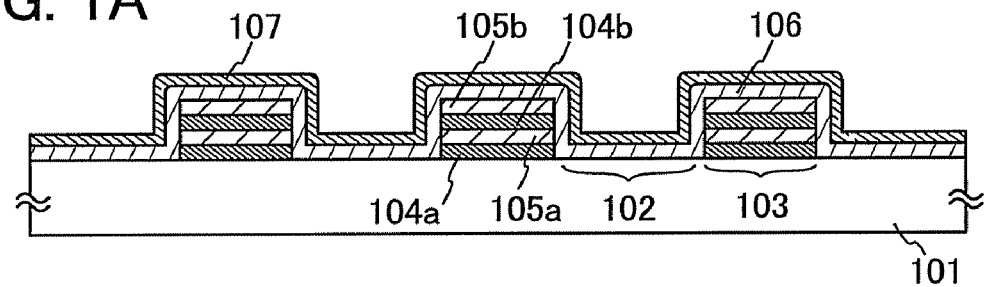
FIGS. 1A to 1D are diagrams illustrating a method for manufacturing an evaporation donor substrate according to an embodiment of the present invention.

An evaporation donor substrate used in this embodiment is described with reference to FIGS. 1A to 1D. As illustrated in FIG. 1A, a function layer 103 having opening portions 102 is formed over a first substrate 101 which is a supporting substrate. Note that the function layer 103 has a structure in which high-refractive index films 104 formed with a material having a high refractive index and low-refractive index films 105 formed with a material having a low refractive index are alternately stacked. Note that the function layer 103 has a structure in which two or more high-refractive index films 104 (104a, 104b) and two or more low-refractive index films 105 (105a, 105b) are alternately stacked.

Further, a light-absorbing layer 106 is formed over the first substrate 101 and the function layer 103. Note that parts of the light-absorbing layer 106 are formed so as to cover the opening portions 102.

Furthermore, a material layer 107 is formed over the light-absorbing layer 106. In FIG. 1A, the function layer 103 having the opening portions 102, the light-absorbing layer 106, and the material layer 107 are each formed over the entire surface of the first substrate 101.

Note that, when the first substrate 101 is irradiated with light, light is transmitted in some cases; therefore, the first substrate 101 preferably has high light transmittance. In addition, the first substrate 101 is preferably formed with a material having low thermal conductivity. With the first substrate 101 having low thermal conductivity, heat obtained from the irradiation light can be efficiently conducted to the material layer. As the first substrate 101, for example, a glass substrate, a quartz substrate, a plastic substrate containing an inorganic material, or the like can be used.

The function layer 103 has a function of transmitting light or reflecting light depending on the wavelength of the irradiation light. Note that, in forming the material layer 107 into a desired pattern, the function layer 103 has a function of reflecting the irradiation light.

Here, a specific structure of the function layer 103 is described. As described above, the function layer 103 has a stacked-layer structure of the high-refractive index films 104 (104a, 104b) and the low-refractive index films 105 (105a, 105b). Note that, in order to make the function layer 103 function as a layer which reflects first light (wavelength=$\lambda_1$) used for irradiation in patterning the material layer 107, the thickness ($x_1$) of the high-refractive index films 104 whose refractive index is $n_1$ is preferably set to about $\lambda_1/4n_1$, more preferably set to $0.9\times(\lambda_1/4n_1) \leq x_{x1} \leq 1.1\times(\lambda_1/4n_1)$, while the thickness ($x_2$) of the low-refractive index films 105 whose refractive index is $n_2$ is preferably set to about $\lambda_1/4n_2$, more preferably set to $0.9\times(\lambda_1/4n_2) \leq x_2 \leq 1.1\times(\lambda_1/4n_2)$. Further, it is preferable that these films are sequentially alternately stacked so that a reflectance (R) of these films with respect to the first light ($\lambda_1$) is greater than or equal to 70%. Note that the reflectance (R) relative to the number of stacked layers (P) of the high-refractive index films 104 and the low-refractive index films 105 is defined by the following formula (2) where the wavelength of the light with which the first substrate 101 is irradiated is $\lambda_1$, the refractive index of the first substrate 101 is $n_0$, the refractive index of the high-refractive index films 104 is $n_1$, the refractive index of the low-refractive index films 105 is $n_2$, and the refractive index of the light-absorbing layer 106 is $n_3$.

$$R = (n_3 \cdot n_1^P - n_0 \cdot n_2^P)/(n_3 \cdot n_1^P + n_0 \cdot n_2^P) \times 100 \text{ (}n\text{ is a natural number)} \quad (2)$$

As a material for forming the high-refractive index films 104, a material whose refractive index is greater than or equal to 2.0, for example, titanium oxide or zinc oxide can be used.

As a material for forming the low-refractive index films 105, a material whose refractive index is lower than 2.0, for example, silicon oxide or magnesium fluoride can be used.

Note that, from the formula (1), in the case where titanium oxide ($n_{TiO2}$=2.5) is used as a material for forming the high-refractive index ($n_1$) films 104, silicon oxide ($n_{SiO2}$=1.5) is used as a material for forming the low-refractive index ($n_2$) films 105, a glass substrate ($n_{glass}$=1.5) is used as the first substrate 101, and titanium nitride ($n_{Ti}$=2.2) is used as the light-absorbing layer 106, and in the case where one high-refractive film 104 and one low-refractive index film 105 are stacked (P=1), the reflectance ($R_{P=1}$) is 36.7%; in the case where two high-refractive index films 104 and two low-refractive films 105 are stacked (P=2), the reflectance ($R_{P=2}$) is 70.2%; in the case where three high-refractive index films 104 and three low-refractive index films 105 are stacked (P=3), the reflectance ($R_{P=3}$) is 88%; and in the case where four high-refractive index films 104 and four low-refractive index films 105 are stacked (P=4), the reflectance ($R_{P=4}$) is 95.5%. That is, in the case of the above conditions, two or more high-refractive index films 104 and two or more low-refractive index films 105 are alternately stacked, whereby the high-refractive index films 104 and the low-refractive index films 105 can sufficiently serve as a function layer.

Figure 14:
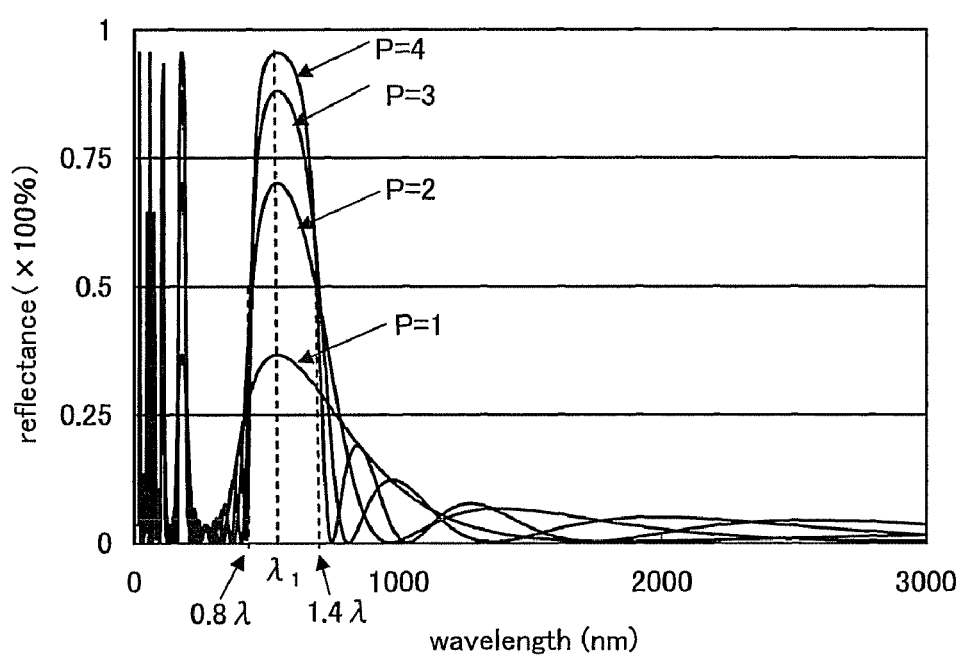
FIG. 14 is a graph showing results of a simulation.

As described above, in the function layer, by increasing the number of stacked layers, the reflectance can be increased; however, from the result shown in FIG. 14, the reflectance with respect to light whose wavelength is out of a certain range from the wavelength of the irradiation light is low, and the function layer transmits the light. Note that the result shown in FIG. 14 shows reflectances of the first substrate, which is a glass substrate and over which the light-absorbing layer formed with titanium nitride and the function layer having a stacked-layer structure are formed, relative to the number of stacked layers, with respect to light with which irradiation is performed from the surface side of the first substrate on which the function layer is formed.

Therefore, in the present invention, as second light (wavelength=$\lambda_2$) used for irradiation after irradiation is performed with first light (wavelength=$\lambda_1$), light in a range of a wavelength such that the function layer has a reflectance of lower than 50% is used. That is, the first wavelength ($\lambda_1$) and the second wavelength ($\lambda_2$) in the present invention satisfy the following formula (3) in the case where a material used for the function layer is any of the above-described materials.

$$\lambda_2 > 1.4\lambda_1 \text{ or } \lambda_2 < 0.8\lambda_1, \text{ and } \lambda_2 \neq \lambda_1/(2n+1) \text{ (}n\text{ is a natural number)} \quad (3)$$

Note that the function layer 103 can be formed by any of a variety of methods. For example, the function layer 103 can be formed by a sputtering method, an electron beam evaporation method, a vacuum evaporation method, or the like.

Although the opening portions 102 described in this embodiment can be formed by any of a variety of methods, the opening portions 102 are preferably formed by dry etching. By use of dry etching, the opening portions 102 can have steep sidewalls and a minute pattern can be formed.

The light-absorbing layer 106 absorbs light which is emitted at the time of evaporation. Therefore, it is preferable that the light-absorbing layer 106 be formed of a material which has low reflectance and high absorptance with respect to irradiation light. Specifically, it is preferable that the light-absorbing layer 106 have a reflectance of less than or equal to 70% with respect to irradiation light.

As a material of the light-absorbing layer 106, for example, a metal nitride such as titanium nitride, tantalum nitride, molybdenum nitride, or tungsten nitride, molybdenum, titanium, tungsten, or the like is preferably used. Note that the light-absorbing layer 106 is not limited to a single layer and may be formed of a plurality of layers.

Since a kind of material that is suitable for the light-absorbing layer 106 thus varies depending on the wavelength of the irradiation light, the material of the light-absorbing layer 106 should be selected as appropriate.

The light-absorbing layer 106 can be formed by any of a variety of methods. For example, the light-absorbing layer 106 can be formed by a sputtering method, an electron beam evaporation method, a vacuum evaporation method, or the like.

Further, although the thickness of the light-absorbing layer 106 depends on a material, it is preferable that the light-absorbing layer 106 have a thickness with which irradiation light is not transmitted (preferably, a thickness of greater than or equal to 100 nm and less than or equal to 2 μm). In particular, with a thickness of greater than or equal to 100 nm and less than or equal to 600 nm, the light-absorbing layer 106 can efficiently absorb the irradiation light to generate heat. Moreover, with a thickness of greater than or equal to 100 nm and less than or equal to 600 nm, the light-absorbing layer 106 can be deposited onto a deposition target substrate with high accuracy.

The light-absorbing layer 106 may partially transmit irradiation light as long as an evaporation material contained in the material layer 107 can be heated to the sublimation temperature thereof. Note that, in the case where the light-absorbing layer 106 partially transmits the irradiation light, it is preferable that a material which is not decomposed by light be used as the evaporation material contained in the material layer 107.

The material layer 107 contains an evaporation material which is evaporated onto the deposition target substrate. When the evaporation donor substrate is irradiated with light, the material layer 107 is heated and the evaporation material contained in the material layer 107 is sublimated and evaporated onto the deposition target substrate.

Note that, although any of a variety of materials can be used as the evaporation material contained in the material layer 107 regardless of whether they are organic compounds or inorganic compounds as long as the material can be evaporated, in the case of forming an EL layer of a light-emitting element as described in this embodiment, a material which can be evaporated to form an EL layer is used. For example, an organic compound such as a light emitting material or a carrier transporting material that forms the EL layer, a carrier injecting material, or an inorganic compound such as metal oxide, metal nitride, metal halide, or an elemental metal, which is used for an electrode of a light emitting element or the like, can be used. Details of the materials which can be evaporated to form an EL layer is given not here but in Embodiment 5; therefore, Embodiment 5 is referred to for details.

The material layer 107 may contain a plurality of materials. In addition, the material layer 107 may be a single layer or a stack of a plurality of layers. Accordingly, by stacking a plurality of layers each containing an evaporation material, co-evaporation is possible. In the case where the material layer 107 has a stacked-layer structure, it is preferable that the layers be stacked so that an evaporation material having a lower sublimation temperature (or a material that can be evaporated at a lower temperature) be contained in a layer near the first substrate. Such a structure makes it possible to efficiently perform evaporation using the material layer 107 which has a stacked-layer structure.

The material layer 107 is formed by any of a variety of methods. For example, a wet method such as a spin coating method, a spray coating method, an ink-jet method, a dip coating method, a casting method, a die coating method, a roll coating method, a blade coating method, a bar coating method, a gravure coating method, or a printing method can be used. Alternatively, a dry method such as a vacuum evaporation method or a sputtering method can be used.

In the case of forming the material layer 107 by a wet method, a desired evaporation material may be dissolved or dispersed in a solvent, and a solution or a dispersion liquid may be adjusted. There is no particular limitation on the solvent as long as an evaporation material can be dissolved or dispersed therein and the solvent does not react with the evaporation material. For example, as a solvent, any of the following can be used: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, and xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like. A mixture of plural kinds of these solvents may also be used. By using a wet method, it is possible to increase material use efficiency, which leads to a reduction in manufacturing cost.

Figure 1B:
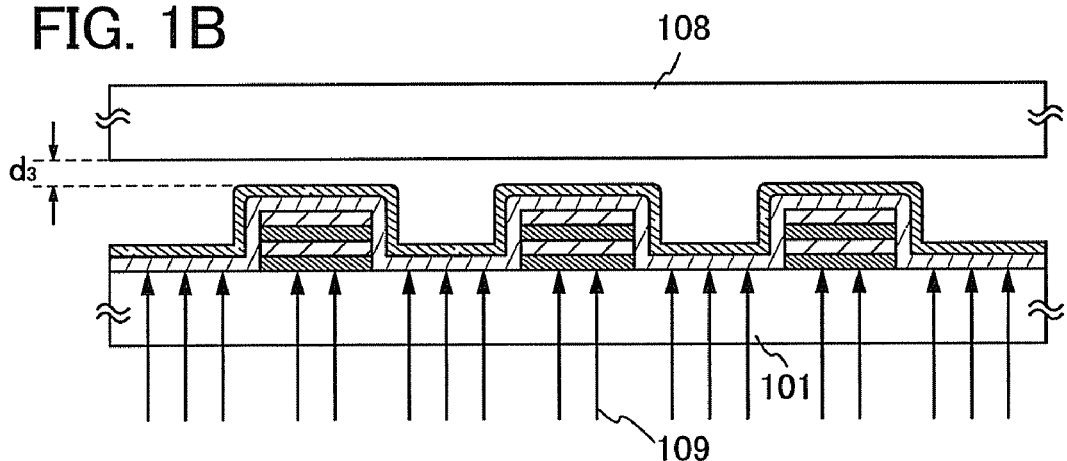

Next, as illustrated in FIG. 1B, a second substrate 108 is placed at a position facing a surface which is one of surfaces of the first substrate 101 and which is provided with the function layer 103, the light-absorbing layer 106, and the material layer 107. Note that the second substrate 108 is a substrate for collecting a material onto which a part of the material layer 107 which is sublimated by light irradiation is intentionally evaporated in forming the material layer 107 formed over the first substrate 101 into a desired shape. As illustrated in FIG. 1B, by providing the second substrate 108, a part of the material layer 107 can be collected; therefore, the material which is collected can be reused in forming a material layer of another evaporation donor substrate.

Further, the first substrate 101 and the second substrate 108 are preferably placed close to each other to face each other so that collection efficiency of the material can be improved. Specifically, the first substrate 101 and the second substrate 108 are placed close to each other to face each other so that a distance $d_3$ between a surface of the material layer 107 over the first substrate 101 and a surface of the second substrate 108 is set to lower than or equal to 2 mm, preferably, lower than or equal to 0.05 mm.

Figure 1C:
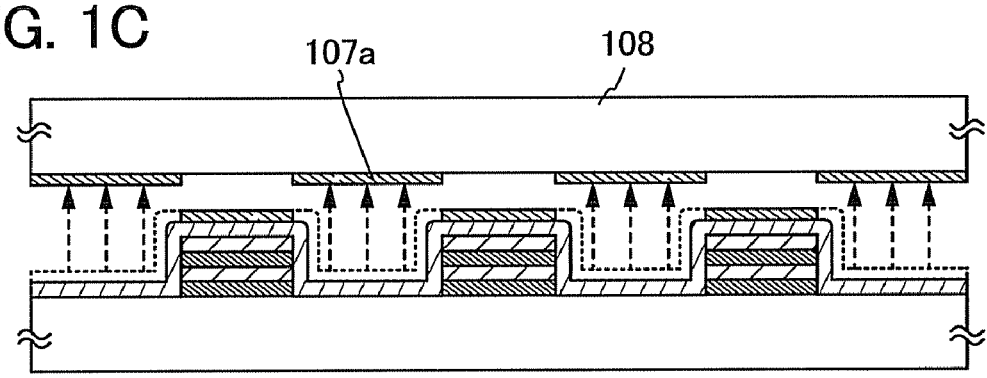

As illustrated in FIG. 1B, when irradiation is performed with first light ($\lambda_1$) 109 from the other surface of the first substrate 101, light with which the function layer 103 over the first substrate 101 is irradiated is reflected and light with which the opening portions 102 are irradiated is absorbed by the light-absorbing layer 106. Then, the light-absorbing layer 106 absorbs light to generate heat and provides the heat to the evaporation material contained in the material layer 107 to sublimate the evaporation material. Thus, material layers 107a which are parts of the material layer 107 are evaporated onto the second substrate 108 (FIG. 1C). Note that the material layers 107a evaporated onto the second substrate 108 can be reused by being collected.

Figure 1D:
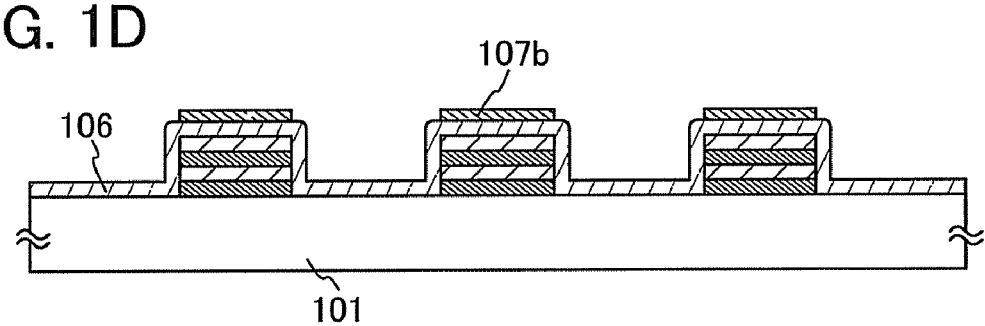

Accordingly, an evaporation donor substrate including material layers 107b at positions which are over the first substrate 101 and overlap with the function layer 103 can be formed (FIG. 1D).

As the first light 109 used for irradiation, light having a spectrum shape in which a half width is small is used. Specifically, laser light can be used. Note that, by using light having a spectrum shape in which a half width is small as light, light with which the function layer 103 is irradiated of the first light 109 with which the first substrate 101 is irradiated can be reflected. Accordingly, only an evaporation material contained in the material layer formed at positions not overlapped with the function layer 103 can be selectively sublimated.

As the laser light, it is possible to use light oscillated from one or more of a gas laser such as an Ar laser, a Kr laser, or an excimer laser; a solid-state laser such as a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, or Ta is added as a dopant, a glass laser, a ruby laser, an alexandrite laser, or a Ti:sapphire laser. Alternatively, a second harmonic or a third harmonic oscillated from the above-described solid-state laser can be used. Note that, when a solid-state laser whose laser medium is solid is used, there are advantages in that a maintenance-free condition can be maintained for a long time and output is relatively stable.

Further, as the above-described laser light, pulsed laser light, continuous-wave (CW) laser light, or the like can be used. Note that, in the case of the pulsed laser light, for example, by using not only laser light having a repetition rate of several Hz to several hundreds kHz but also laser light having a repetition rate of greater than or equal to 1 MHz, irradiation time can be shortened and accuracy of patterning can be improved. In addition, the shape of a laser spot is preferably linear or rectangular.

In the present invention, the material layer 107 is heated not with radiation heat from the irradiation light but with the irradiation light absorbed by the light-absorbing layer 106. Therefore, it is preferable to set irradiation time of light to be short so that an area of the material layer 107 which is heated is not enlarged due to conduction of heat in a plane direction from a part of the light-absorbing layer 106 which is irradiated with the light to a part of the light-absorbing layer 106 which is not irradiated with light.

Further, it is preferable that the material layer 107 be patterned by light irradiation in a reduced pressure atmosphere. Accordingly, it is preferable that the treatment chamber be under a pressure of less than or equal to $5 \times 10^{-3}$ Pa, more preferably greater than or equal to $10^{-6}$ Pa and less than or equal to $10^{-4}$ Pa.

Next, a deposition method using the first substrate 101 including the material layers 107b illustrated in FIG. 1D as an evaporation donor substrate is described with reference to FIGS. 2A to 2C. Note that, here, a method for depositing an EL layer of a light-emitting element using an evaporation donor substrate is described.

Figure 2A:
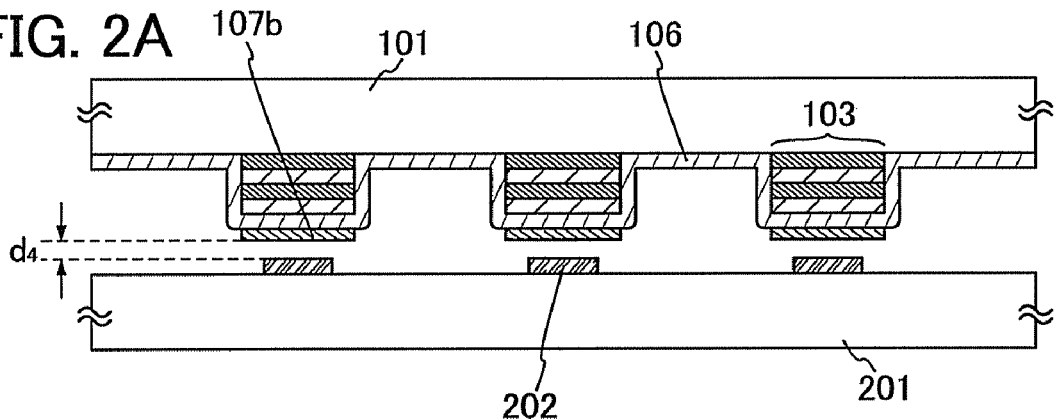
FIGS. 2A to 2C are diagrams illustrating a method for manufacturing an evaporation donor substrate according to an embodiment of the present invention.

In FIG. 2A, a surface of the first substrate 101, which is provided with the function layer 103, the light-absorbing layer 106, and the material layers 107b, is placed to face a deposition target surface of a third substrate which is a deposition target substrate.

A third substrate 201 is a deposition target substrate onto which a desired layer is deposited by evaporation treatment using an evaporation donor substrate. Note that, since the case where an EL layer of a light-emitting element is formed using the evaporation donor substrate is described here, first electrodes 202 which each serve as one of electrodes of a light-emitting element are formed over the third substrate 201. Then, the first substrate 101 and the third substrate 201 are placed to face each other in proximity; specifically, they are placed close to each other so that a distance $d_4$ between surfaces of the material layers 107b over the first substrate 101 and a surface of the third substrate 201 (specifically, the surfaces of the first electrodes 202) is greater than or equal to 0 mm and less than or equal to 10 μm, preferably greater than or equal to 0 mm and less than or equal to 5 μm, and more preferably greater than or equal to 0 mm and less than or equal to 3 μm.

Figure 3A:
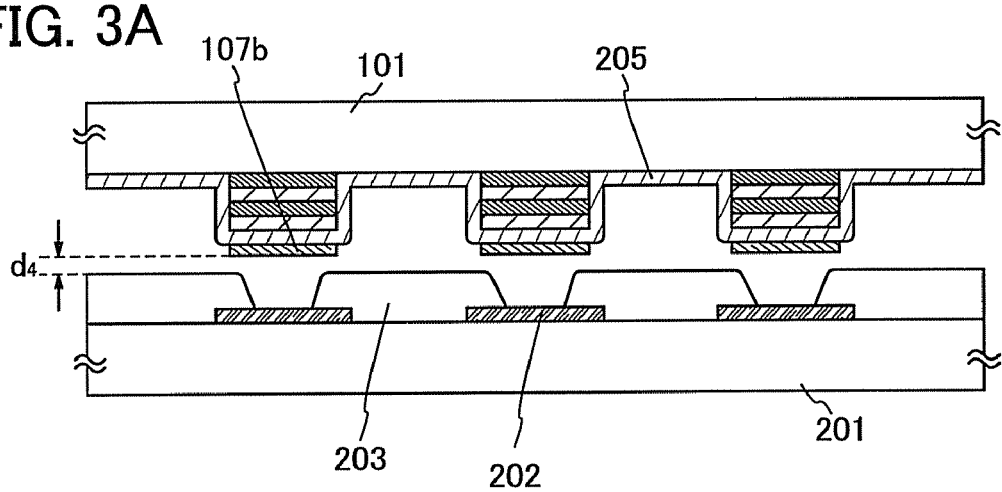
FIGS. 3A to 3C are diagrams illustrating an evaporation donor substrate and a deposition method according to an embodiment of the present invention.

Note that the distance $d_4$ is defined as the distance between the outermost surface of the first substrate 101 and the outermost surface of the third substrate 201. In the case where the first electrodes 202 and an insulator 203 formed to cover end portions of the first electrodes 202 are formed over the third substrate 201 as illustrated in FIG. 3A, the distance $d_4$ is defined as the distance between the surfaces of the material layers 107b over the first substrate 101 and surfaces of the insulator 203 formed over the third substrate 201. Note that, if the surfaces of the material layers 107b over the first substrate 101 or the outermost surface of the layer formed over the third substrate 201 has projections and depressions, the distance $d_4$ is defined as the shortest distance between the surfaces of the material layers 107b over the first substrate 101 and the outermost surface of the layer formed over the third substrate 201.

Figure 2B:
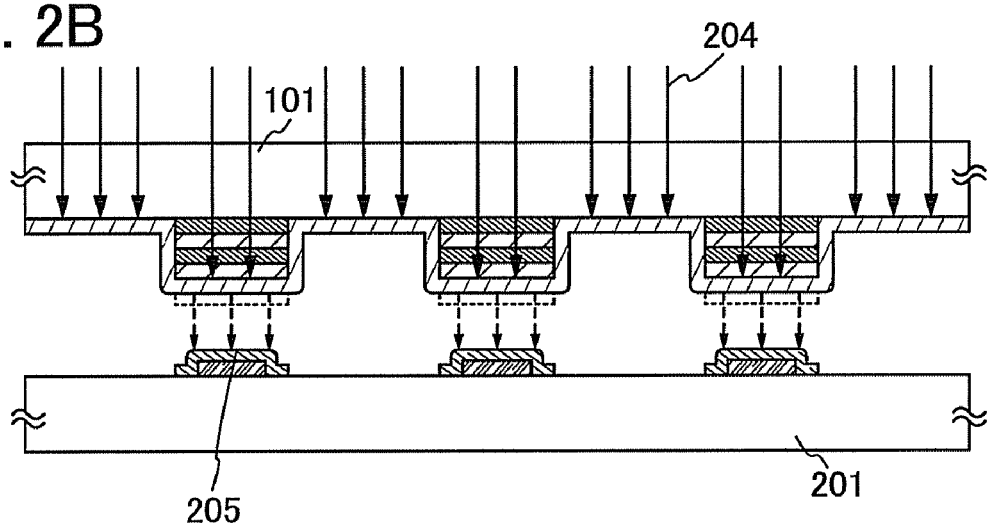

Next, as illustrated in FIG. 2B, irradiation is performed with second light (wavelength=$\lambda_2$) 204 from a rear surface (the surface not provided with the function layer 103, the light-absorbing layer 106, and the material layers 107b) side of the first substrate 101. Note that the second light (wavelength=$\lambda_2$) 204 satisfies the relationship in the above formula (3).

Figure 3B:
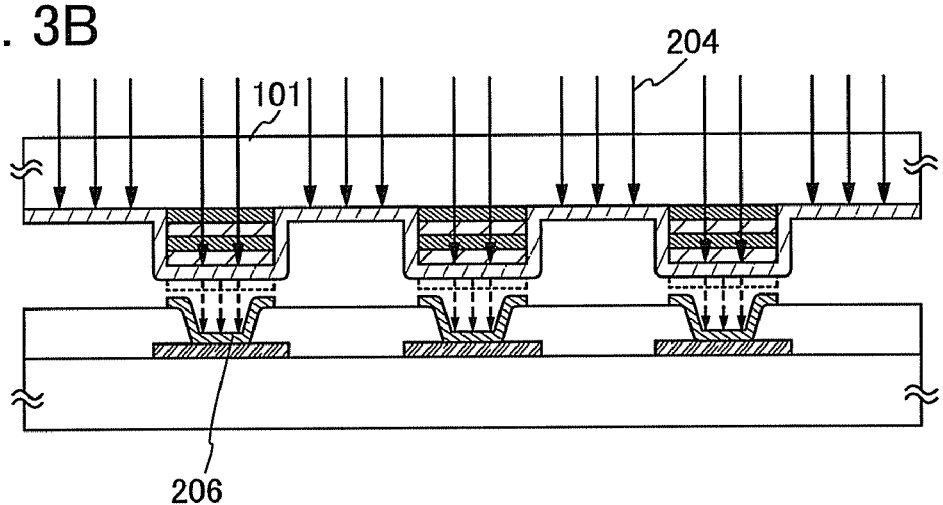
Figure 3C:
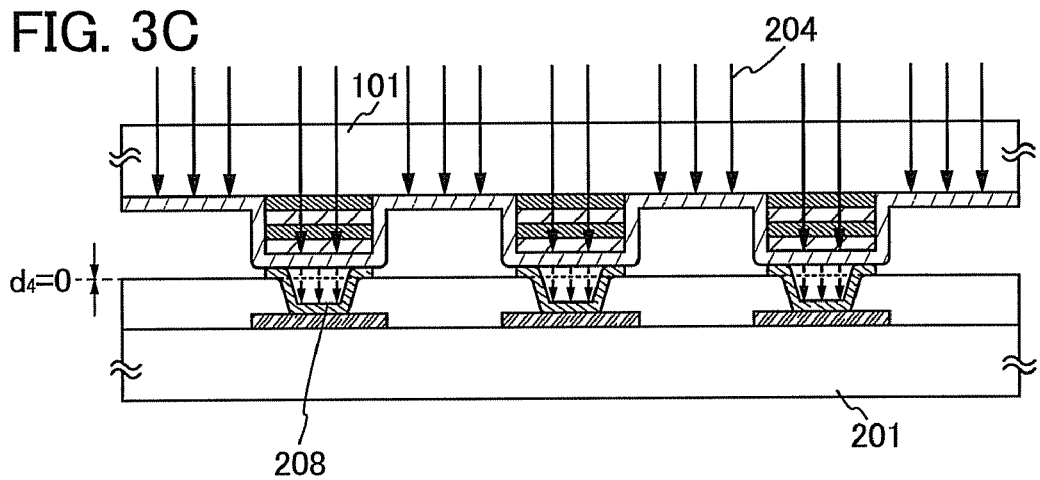

Since the function layer 103 can transmit the second light (wavelength=$\lambda_2$) 204, by irradiating the function layer 103 with the second light (wavelength=$\lambda_2$) 204, parts of the light-absorbing layer 106, which are at positions overlapped with the function layer 103, are irradiated with light. Because of heat from the light-absorbing layer 106, the evaporation material contained in the material layers 107b is evaporated onto the first electrodes 202 which are formed over the third substrate 201; thus, EL layers 205 of the light-emitting elements can be formed. Note that the case of a structure in FIGS. 3A to 3C is similar, and the EL layers 205 of the light-emitting elements are formed over the first electrodes 202 over the third substrate 201 as illustrated in FIG. 3B.

Note that, as the second light 204, lamp light or laser light which satisfies the above formula (2) can be used. Note that lamp light with which a large area can be irradiated at a time is more preferably used. For example, in the case where a halogen lamp is used as light, the entire first substrate 101 can be heated at a temperature of greater than or equal to 500° C. by irradiating the first substrate 101 for about 7 s; therefore, the evaporation material contained in the material layer 107 can be sublimated.

When a lamp is used as a light source of the second light 204, discharge lamps such as a flash lamp (such as a xenon flash lamp or krypton flash lamp), a xenon lamp, or a metal halide lamp, or exothermic lamps such as a halogen lamp or a tungsten lamp can be used. A flash lamp is capable of repeatedly irradiating a large area with very high-intensity light in a short time (0.1 msec to 10 msec). In addition, the amount of light with which the third substrate 201 is irradiated can be controlled by change of interval of light emission of a flash lamp. Moreover, since power consumption of a flash lamp while waiting for light emission is low, running cost can be kept low.

It is preferable that evaporation by light irradiation be performed in a reduced pressure atmosphere. Accordingly, it is preferable that the deposition chamber have a pressure of less than or equal to $5 \times 10^{-3}$ Pa, more preferably greater than or equal to $10^{-6}$ Pa and less than or equal to $10^{-4}$ Pa.

Note that, here, the case where the material layer 107 is heated with the light-absorbing layer 106 which absorbs light from a light source is described; however, an embodiment of the present invention is not limited thereto, and radiation heat from light from a light source may be used. Therefore, the evaporation material contained in the material layers 107b may be sublimated not only by light irradiation but also by direct heating using a heat source such as a heater.

Figure 2C:
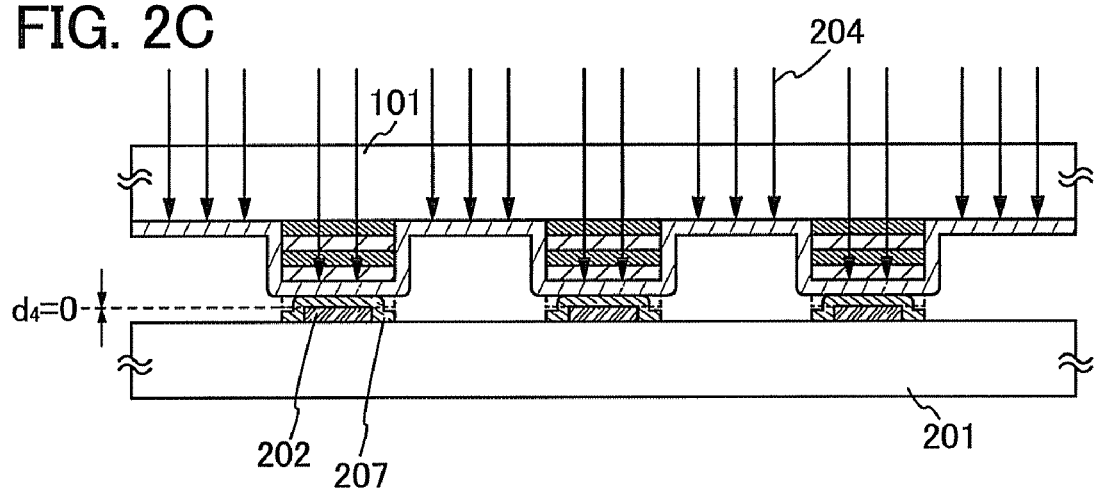

Alternatively, the distance $d_4$ between the first substrate 101 and the third substrate 201 may be set to 0 mm as illustrated in FIG. 2C. That is, the case where the material layers 107b over the first substrate 101 and the surfaces of the first electrodes 202 formed over the third substrate 201 are in contact with each other is described. Thus, by shortening the distance $d_4$, misalignment of a deposition region can be prevented, and blur of a deposition pattern on the deposition target surface can be prevented. Therefore, EL layers 207 of light-emitting elements can be formed over the third substrate 201 with high accuracy. Further, in FIGS. 3A to 3C, the case where parts of the first electrodes 202 which are formed over the third substrate 201 are covered with the insulator 203 and the first substrate 101 is irradiated with the second light 204 is described. As illustrated in FIG. 3B, by shortening the distance $d_4$ between the first substrate 101 and the third substrate 201 also in this case, misalignment of a deposition region can be prevented; therefore, blur of a deposition pattern on the deposition target surface can be prevented and EL layers 206 can be formed. Note that, in the case of FIGS. 3A to 3C, when the distance $d_4$ between the first substrate 101 and the third substrate 201 is 0 mm, as illustrated in FIG. 3C, the surfaces of the material layers 107b over the first substrate 101 and the surfaces of the insulator 203 formed over the third substrate 201 are in contact with each other; therefore, blur of a deposition pattern on the deposition target surface due to the misalignment of the deposition region can be efficiently prevented. Therefore, as illustrated in FIG. 3C, EL layers 208 of the light-emitting elements can be formed with high accuracy in contact with the first electrodes 202 over the third substrate 201.

Note that, in this embodiment, although the case is described where the third substrate 201 is positioned below the first substrate 101, the present invention is not limited thereto. The orientation of the substrates can be determined as appropriate.

In the above-described deposition method using an evaporation donor substrate which is an embodiment of the present invention, by irradiating the evaporation donor substrate including the function layer 103, which is formed by alternately stacking the high-refractive index films and the low-refractive index films whose optical distance is one fourth ($=\lambda_1/4$) with respect to the wavelength ($\lambda_1$) of the first light 109, with the first light 109 having the wavelength ($\lambda_1$), the first light 109 is reflected by the function layer 103, and only the evaporation material of the material layer which is formed at positions not overlapped with the function layer 103 can be sublimated using heat from the light-absorbing layer 106; therefore, the material layer can be patterned into a desired shape.

Further, in evaporating the material layers 107b which are patterned onto the deposition target substrate, by irradiating the evaporation donor substrate with the second light (wavelength=$\lambda_2$) 204 which satisfies the relationship in the above formula (3), parts of the light-absorbing layer 106, which overlap with the function layer, can be irradiated with light, and therefore, the evaporation material of the material layers 107b which are patterned can be evaporated using heat from the light-absorbing layer 106. Note that, in the case where a lamp is selected as a light source, a large area can be deposited at a time; therefore, manufacturing cost of a light-emitting device can be reduced.

Note that, since the material layer over the evaporation donor substrate is formed into a desired shape before evaporation, the material contained in the material layer can be evaporated onto the deposition target substrate with high accuracy. Further, since the evaporation material which is sublimated in patterning the material layer can be reused because it can be collected, manufacturing cost can be reduced.

(Embodiment 2)

In this embodiment, in a deposition method using an evaporation donor substrate according to an embodiment of the present invention, an apparatus is described which is used in the case where an evaporation donor substrate is irradiated with laser light as the first light.

Figure 4:
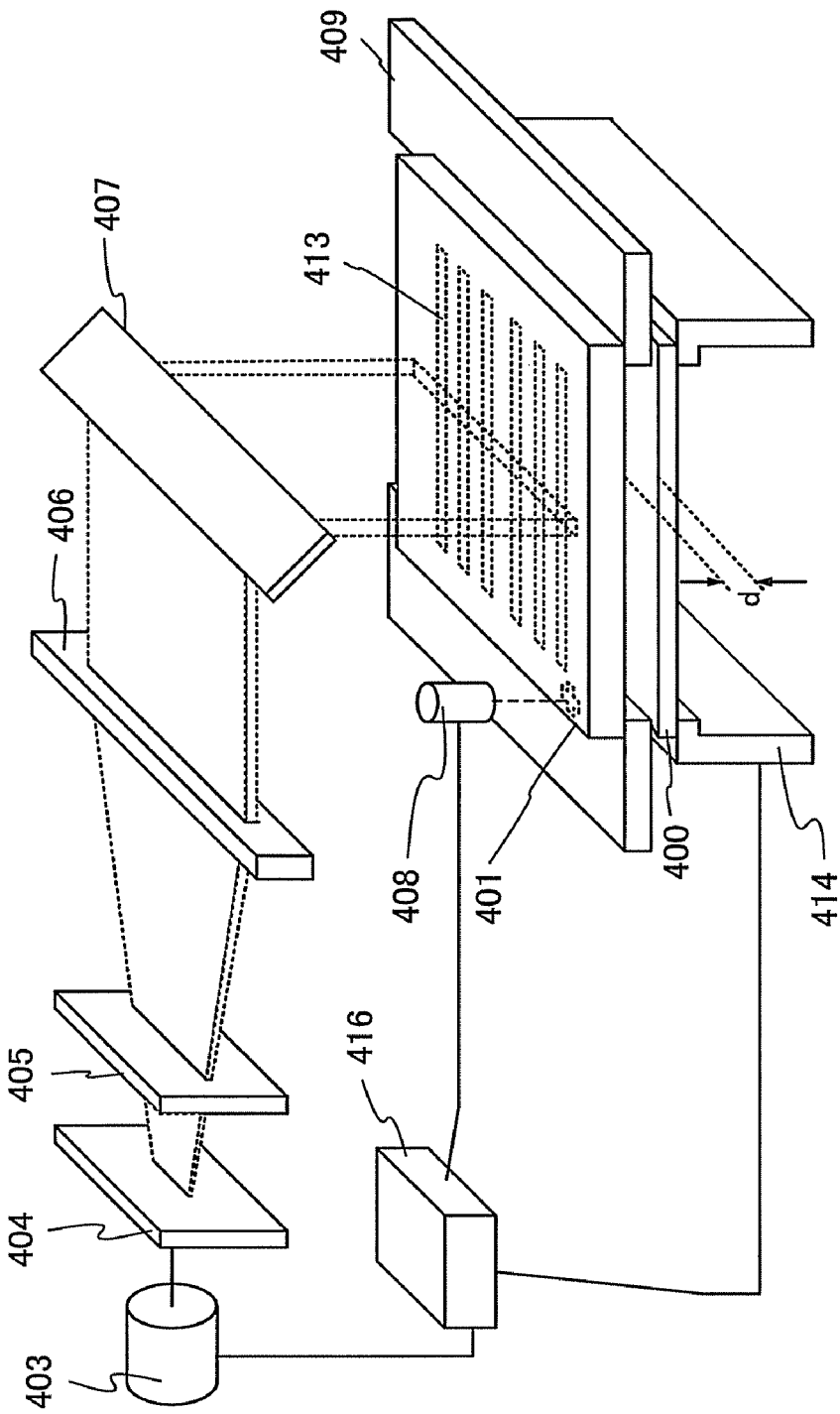
FIG. 4 is a diagram illustrating an apparatus in which a laser is used as a light source.

FIG. 4 is a perspective view illustrating an example of an apparatus using laser light. Laser light is outputted from a laser 403 (a YAG laser device, an excimer laser device, or the like) and transmitted through a first optical system 404 for changing a laser beam shape into a rectangular shape, a second optical system 405 for shaping the laser beam, and a third optical system 406 for collimating the laser beam; and an optical path is bent in a direction perpendicular to a first substrate 401, which is an evaporation donor substrate, over a first substrate stage 409 by using a reflecting mirror 407. Then, the first substrate 401 is irradiated with the laser beam.

Note that a structure of the evaporation donor substrate described in this embodiment is similar to that described in Embodiment 1. That is, the function layer, the light-absorbing layer, and the material layer are formed over the first substrate 401. Note that regions 413 surrounded by dotted lines in FIG. 4 are provided with the function layer.

The shape of a laser spot with which the first substrate 401 is irradiated is preferably rectangular or linear. Furthermore, in the case of using a large-sized substrate, a laser spot preferably has a longer side of 20 cm to 100 cm in order to shorten processing time. Further, a plurality of lasers and optical systems shown in FIG. 4 may be provided so that a large-sized substrate is processed in a short time. Specifically, a laser beam may be emitted from each of the plurality of lasers so that the area to be processed of one substrate is divided by the laser beams.

Note that FIG. 4 shows an example, and there is no particular limitation on positional relationship between each optical system and electro-optical element placed in the path of laser light. For example, the reflecting mirror 407 can be omitted if the laser 403 is placed above the first substrate 401 so that laser light is emitted from the laser 403 in a direction perpendicular to a principle plane of the first substrate 401. Further, each optical system may employ a condenser lens, a beam expander, a homogenizer, a polarizer, or the like, and these may be combined. Further, as each optical system, a slit may be combined.

By two-dimensionally scanning the irradiation region with the laser beam on a surface to be irradiated as appropriate, irradiation is performed on a large area of the substrate. In order to perform scanning, the irradiation region with the laser beam and the substrate are relatively moved. Here, scanning is performed with a moving means (not illustrated), for moving the first substrate stages 409 holding the first substrate 401 which is an evaporation donor substrate in X and Y directions, being controlled by a control device 416. Note that the control device 416 is preferably operated so that it can also control the laser 403. Moreover, the control device 416 is preferably interlocked with a position alignment mechanism 408 which has an imaging element for recognizing position markers.

Further, the first substrate 401 and a second substrate 400 are placed close to each other to face each other so that a distance d which is a distance between the first substrate 401 and the second substrate 400 is less than or equal to 2 mm, preferably less than or equal to 0.05 mm. Note that a surface of a material layer and a surface of the second substrate 400 are preferably not in contact with each other.

In the case where the material layer is patterned using the apparatus illustrated in FIG. 4, at least the first substrate 401 and the second substrate 400 are placed in a vacuum chamber. Alternatively, all the components illustrated in FIG. 4 may be placed in a vacuum chamber.

Although FIG. 4 shows an example of a deposition apparatus employing a so-called face-up system in which the deposition target surface of the second substrate 400 faces upward, a deposition apparatus employing a face-down system may also be used. In addition, a deposition apparatus employing a so-called vertical placement system in which a principle plane of the second substrate 400 is vertically set up with respect to the horizontal plane may be used.

By using such an apparatus, the material layer over the evaporation donor substrate can be patterned. Further, in patterning the material layer, since an evaporation material which is evaporated onto the second substrate can be reused by being collected, manufacturing cost can be reduced.

Note that a structure shown in this embodiment can be combined with a structure shown in Embodiment 1 as appropriate.

(Embodiment 3)

In this embodiment, in a deposition method using an evaporation donor substrate according to an embodiment of the present invention, an apparatus which is used in the case where an evaporation donor substrate including a material layer which is patterned is irradiated with lamp light as the second light is described.

Figure 5A:
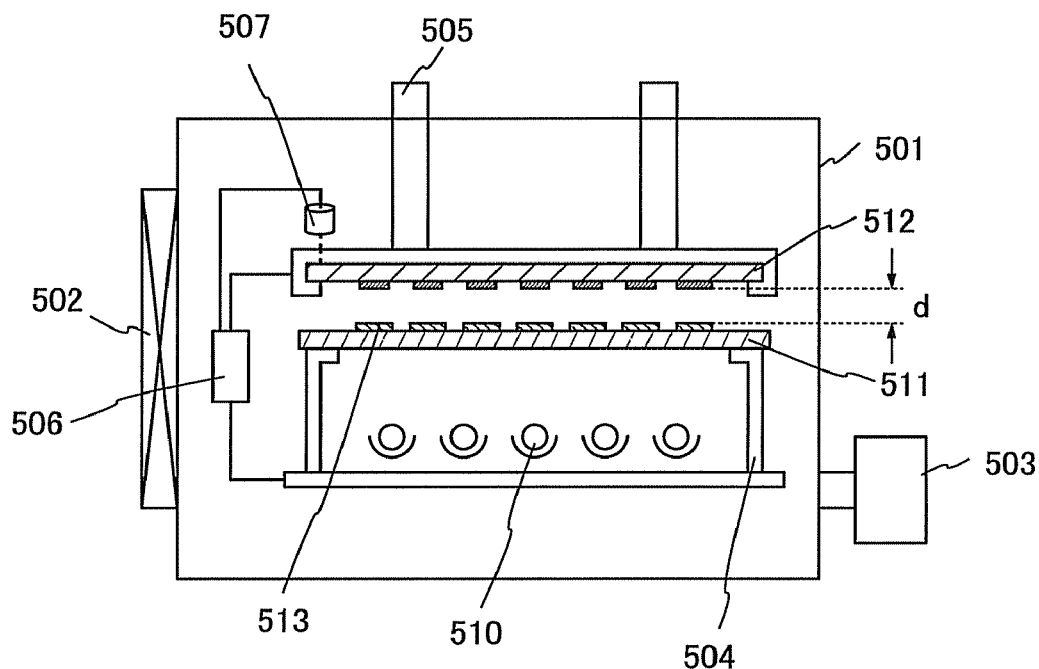
FIGS. 5A and 5B are diagrams illustrating an apparatus in which a lamp is used as a light source.

In FIG. 5A, a deposition chamber 501 is a vacuum chamber and is connected to another chamber via a gate valve 502. Further, the deposition chamber 501 is provided with an exhaust mechanism 503. In addition, in the deposition chamber 501, at least a substrate stage 504 for holding a first substrate 511 (including material layers 513) which is an evaporation donor substrate, substrate supporting units 505 for holding a third substrate 512 which is a deposition target substrate, and light sources 510 are provided.

Note that, over the first substrate 511 which is held by the substrate stage 504, the material layer is patterned by performing treatment shown in any of Embodiments 1 and 2 in another chamber. That is, in another chamber, after the material layer over the first substrate 511 is patterned, the first substrate 511 is transferred to the deposition chamber 501 and set on the substrate stage 504. The third substrate 512 is fixed to the substrate supporting units 505 so that a surface of the first substrate 511, over which the material layers 513 are formed, faces a deposition target surface of the third substrate 512 which is a deposition target substrate.

The substrate supporting units 505 are moved so that a distance between the first substrate 511 and the third substrate 512 becomes the distance d. Note that the distance d is defined as a distance between surfaces of the material layers 513 formed over the first substrate 511 and a surface of the third substrate 512. Further, in the case where some layer (e.g., a conductive layer which functions as an electrode or an insulator which functions as a partition wall) is formed over the third substrate 512, the distance d is defined as the distance between the surfaces of the material layers 513 over the first substrate 511 and the surface of the layer formed over the third substrate 512. Note that in the case where the surfaces of the material layers 513 formed over the first substrate 511 or the surface of the third substrate 512 or the layer formed over the third substrate 512 has projections and depressions, the distance d is defined as the shortest distance between the surfaces of the material layers 513 over the first substrate 511 and the outermost surface of the third substrate 512 or the layer formed over the third substrate 512. Specifically, the distance d is greater than or equal to 0 mm and less than or equal to 10 µm, preferably greater than or equal to 0 mm and less than or equal to 5 µm, and more preferably greater than or equal to 0 mm and less than or equal to 3 µm.

Figure 5B:
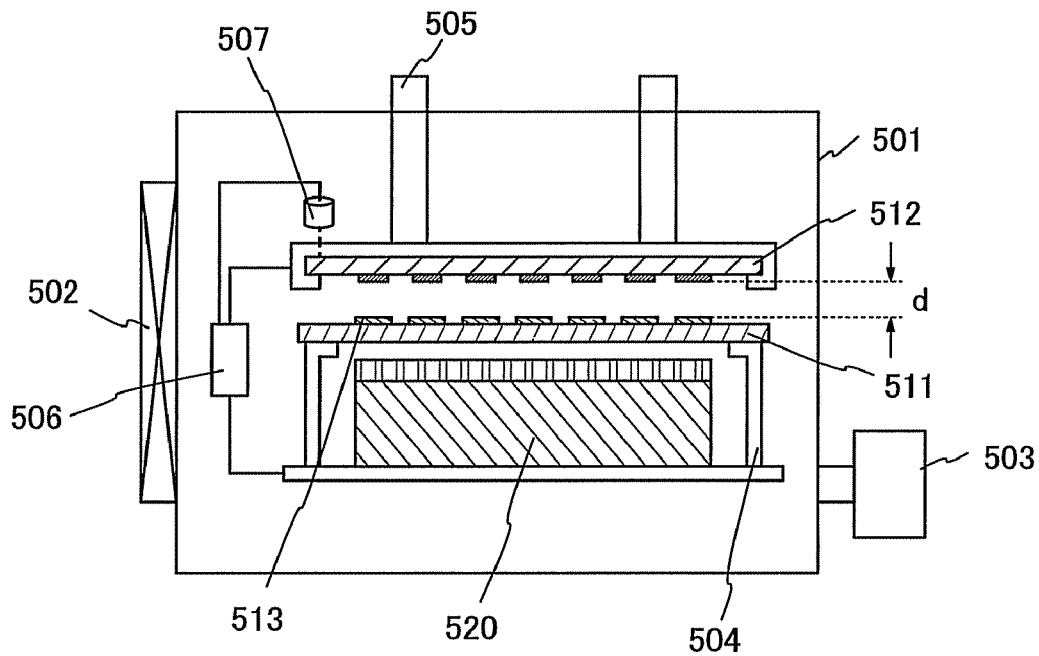

Here, the distance d is set to 2 mm. If the third substrate 512 is hard like a quartz substrate and formed of a material which is unlikely to be deformed (warped, bent, or the like), the distance d can be shortened to 0 mm as the minimum distance. Although FIGS. 5A and 5B illustrate an example in which the pair of the substrate stages 504 are fixed while the substrate supporting units 505 are moved for controlling the distance between the substrates, a structure may also be employed in which the pair of the substrate stages 504 are moved while the substrate supporting units 505 are fixed. In addition, both the pair of the substrate stages 504 and the substrate supporting units 505 may be moved. Note that FIGS. 5A and 5B illustrate cross sections of a step in which the substrate supporting units 505 are moved so that the first substrate 511 and the third substrate 512 are placed close to each other at the distance d therebetween.

In FIGS. 5A and 5B, the case is described where the pair of the substrate stages 504 and the substrate supporting units 505 are provided with a moving means (not illustrated) which moves the pair of the substrate stages 504 and the substrate supporting units 505 not only in a vertical direction but also in X and Y directions and precise alignment is performed by controlling the moving means by a control device 506. Note that the control device 506 is preferably interlocked with a positional alignment mechanism 507 which has an imaging element for recognizing a position marker on the substrate (in this case, the third substrate 512). In addition, a sensor for measuring the temperature or humidity inside the deposition chamber 501, or the like may be provided.

Then, irradiation is performed with the second light from the surface side of the first substrate 511 on which the material layers 513 are not formed. Accordingly, the material layers 513 which are patterned over the first substrate 511 are heated in a short time, and an evaporation material contained in the material layers 513 is sublimated; thus, the evaporation material is deposited onto the deposition target surface (i.e., a lower surface) of the third substrate 512 which is placed so as to face the first substrate 511. In a deposition apparatus in FIGS. 5A and 5B, when the material layers 513 over the first substrate 511 has a uniform and desired thickness in advance, deposition of a film with a uniform and desired thickness can be performed on the third substrate 512 without providing a thickness monitor. Although a substrate is rotated in a conventional evaporation apparatus, the deposition target substrate is fixed during deposition in the deposition apparatus illustrated in FIGS. 5A and 5B; thus, this deposition apparatus is suitable for deposition on a large-area glass substrate that is easily broken. In addition, in the deposition apparatus in FIGS. 5A and 5B, the evaporation donor substrate is also fixed during deposition.

Note that it is preferable that the contact area of the light sources 510 with the first substrate 511 which is an evaporation donor substrate be large for uniform heating.

In order to reduce thermal effects on the material layers 513 formed over the first substrate 511 due to heat from the light sources on standby, an openable and closable shutter used for thermal insulation on standby (before an evaporation process) may be provided between the light sources 510 and the first substrate 511.

Examples of lamps used as the light sources 510 are as follows: discharge lamps such as a flash lamp (e.g., a xenon flash lamp and a krypton flash lamp), a xenon lamp, and a metal halide lamp; and exothermic lamps such as a halogen lamp and a tungsten lamp. A flash lamp is capable of repeatedly emitting very high-intensity light for a short time (0.1 msec to 10 msec) over a large area; thus, heating can be performed uniformly and efficiently regardless of the area of the first substrate. In addition, heating of the first substrate 511 can be controlled by change of interval of light emission of a flash lamp. Moreover, since power consumption of a flash lamp while waiting for light emission is low, running cost can be kept low. In addition, immediate heating is easy by using the flash lamp to simplify a vertical movement mechanism, a shutter, or the like in a case of using the heater. Thus, further reduction in size of the deposition apparatus can be achieved.

Although FIGS. 5A and 5B show an example in which the light sources 510 are placed in the deposition chamber 501, a part of an inner wall of the deposition chamber may be made of a light-transmitting member and the light sources 510 may be placed outside the deposition chamber. When the light sources 510 are placed outside the deposition chamber 501, maintenance such as replacement of light bulbs of the light sources 510 can be made easier.

Further, the deposition chamber 501 may be provided with a mechanism for controlling the temperature of the third substrate 512. In the case where a cooling mechanism is provided as a mechanism for controlling the temperature, for example, by providing the substrate supporting units 505 with a tube through which a heat medium flows and making a refrigerant flow through the tube in the deposition chamber 501, the substrate supporting units 505 can be used as cold plates. As described above, providing a cooling mechanism is useful in the case where different kinds of material layers are stacked. On the other hand, in the case where a heating mechanism is provided, the substrate supporting units 505 may be provided with a heating means such as a heater 520. As described above, by providing a mechanism for controlling (heating or cooling) the temperature of the third substrate 512, warp of the substrate or the like can also be suppressed.

Although FIGS. 5A and 5B show an example of a deposition apparatus employing a face-down system in which the deposition target surface of the third substrate 512 faces downward, a deposition apparatus employing a face-up system in which the deposition target surface of the third substrate 512 faces upward can also be applied. In addition, although FIGS. 5A and 5B show an example of a deposition apparatus employing a system in which a substrate is placed horizontally, a system in which a substrate is placed vertically can also be applied.

By using such a deposition apparatus, the material layer over the evaporation donor substrate can be evaporated onto the deposition target substrate. Note that the material layer over the evaporation donor substrate is patterned in advance; therefore, the evaporation material can be evaporated onto the deposition target substrate with high accuracy.

Note that, by using lamps as light sources, deposition can be performed on a large area at a time, cycle time can be shortened, and manufacturing cost of a light-emitting device can be reduced.

Note that the structure shown in this embodiment can be combined with any of the structures shown in Embodiments 1 and 2 as appropriate.

(Embodiment 4)

In this embodiment, a method for manufacturing a light-emitting device that is capable of full-color display by forming an EL layer of a light-emitting element with the use of a plurality of evaporation donor substrates according to an embodiment of the present invention is described.

In Embodiment 1, through one deposition process, EL layers containing the same kind of material are formed over the third substrate which is a deposition target substrate. Described in Embodiment 4 is the case where EL layers of three different emission colors are formed over different places of the third substrate.

First, three first substrates each of which is an evaporation donor substrate illustrated in FIG. 1D in Embodiment 1 are prepared. Note that a material layer containing an evaporation material for forming EL layers of a different emission color is formed in each substrate. Specifically, a first substrate (R) having a material layer (R) for forming an EL layer exhibiting red light emission (an EL layer (R)), a first substrate (G) having a material layer (G) for forming an EL layer exhibiting green light emission (an EL layer (G)), and a first substrate (B) having a material layer (B) for forming an EL layer exhibiting blue light emission (an EL layer (B)) are prepared.

In addition, the third substrate which is a deposition target substrate illustrated in FIG. 2A in Embodiment 1 is prepared. Note that a plurality of the first electrodes 202 are formed over the third substrate.

First, as a first deposition process, the third substrate and the first substrate (R) are superimposed on each other and aligned with each other as in FIG. 2A. It is preferable that the third substrate be provided with an alignment marker. The first substrate (R) is also preferably provided with an alignment marker. Note that since the first substrate (R) includes a light-absorbing layer, the light-absorbing layer near the alignment marker is preferably removed in advance. Further, the material layer (R) over the first substrate (R) is patterned only at positions which overlap with a function layer (R) 103.

Then, irradiation is performed with the second light from a rear surface (the surface over which the function layer 103, the light-absorbing layer 106, and the material layers 107b, which are illustrated in FIG. 2A, are not formed) side of the first substrate (R). Since the function layer 103 transmits the second light, by providing heat due to light which is absorbed by the light-absorbing layer 106 to the material layer (R), the evaporation material contained in the material layer (R) is sublimated, and the EL layer (R) is formed over the first electrodes over the third substrate 201. After the first deposition process is completed, the first substrate (R) is moved away from the third substrate 201.

Next, as a second deposition process, the third substrate 201 and the first substrate (G) are superimposed on each other and aligned with each other. Note that a function layer (G) formed over the first substrate (G) is formed at a position which is shifted by one pixel from that of the function layer (R) formed over the first substrate (R) used in the first deposition.

Then, irradiation is performed with the first light from a rear surface (the surface over which the function layer 103, the light-absorbing layer 106, and the material layers 107b, which are illustrated in FIG. 2A, are not formed) side of the first substrate (G). The light-absorbing layer 106 absorbs light and provides heat which is conducted in a plane direction to the material layer (G) to sublimate the evaporation material contained in the material layer (G). Thus, the EL layer (G) is formed over some of the first electrodes over the third substrate 201, which are next to the first electrodes over which the EL layer (R) is formed in the first deposition. After the second deposition is completed, the first substrate (G) is moved away from the third substrate 201.

Next, as a third deposition process, the third substrate 201 and the first substrate (B) are superimposed on each other and aligned with each other. Note that a function layer (B) formed over the first substrate (B) is formed at a position which is shifted by two pixels from that of the function layer (R) formed over the first substrate (R) used in the first deposition.

Figure 6A:
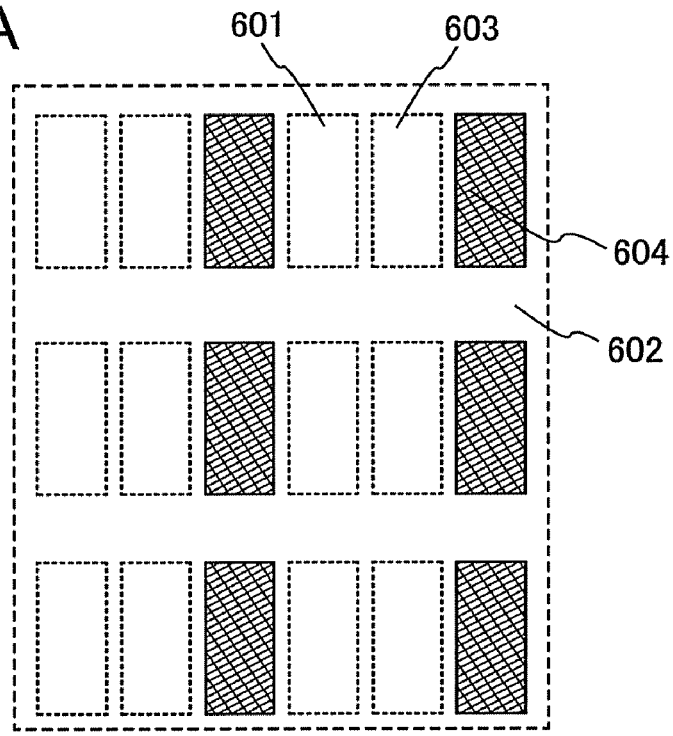
FIGS. 6A and 6B are diagrams illustrating an evaporation donor substrate and a pixel array of EL layers for full-color display.

Then, irradiation is performed with the second light from a rear surface (the surface over which the function layer 103, the light-absorbing layer 106, and the material layers 107b, which are illustrated in FIG. 2A, are not formed) side of the first substrate (B). A state right before the third deposition corresponds to a top view of FIG. 6A. In FIG. 6A, the material layer (B) is formed at a position which overlaps with a function layer (B) 604, and the light-absorbing layer 106 absorbs the second light which is transmitted through the function layer (B) 604, and further, the second light is transmitted as heat to the material layer (B); thus, the evaporation material contained in the material layer (B) is sublimated, and the EL layer (B) is formed over some of the first electrodes over the third substrate 201, which are next to the first electrodes over which the EL layer (G) is formed in the second deposition. After the third deposition is completed, the first substrate (B) is moved away from the third substrate 201.

In this manner, an EL layer (R) 611, an EL layer (G) 612, and an EL layer (B) 613 can be formed at regular intervals over the third substrate. Then, a second electrode is formed over these films. Thus, light-emitting elements can be formed.

Through the above steps, light-emitting elements which exhibit light emission of different colors are formed over one substrate, whereby a light-emitting device capable of full-color display can be formed.

Figure 6B:
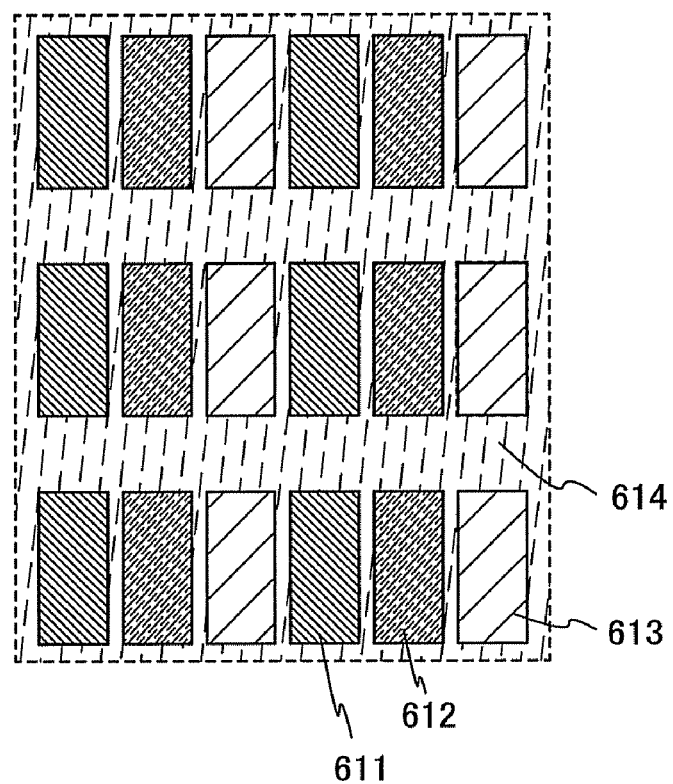

Although FIGS. 6A and 6B illustrate an example in which function layers (a function layer (R) 601, a function layer (G) 603, and a function layer (B) 604) formed over the first substrates which are evaporation donor substrates each have a rectangular shape, an embodiment of the present invention is not limited to this example and these function layers may be successively formed (in a so-called line shape) in the case where neighboring light-emitting regions emit light of the same color. In the case where the function layers are formed in a line shape, deposition is performed also between regions emitting light of the same color; therefore, an insulator or the like is preferably formed between the first electrodes which form the light-emitting regions.

Figure 7A:
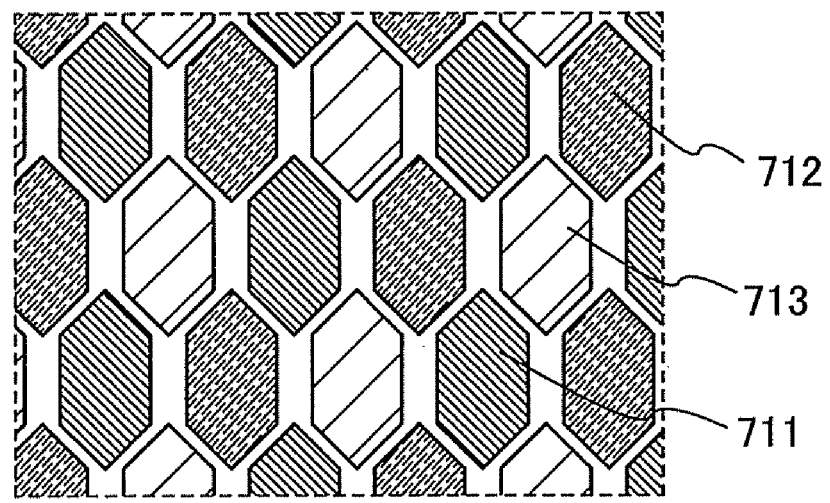
FIGS. 7A and 7B are diagrams illustrating an evaporation donor substrate and a pixel array of EL layers for full-color display.
Figure 7B:
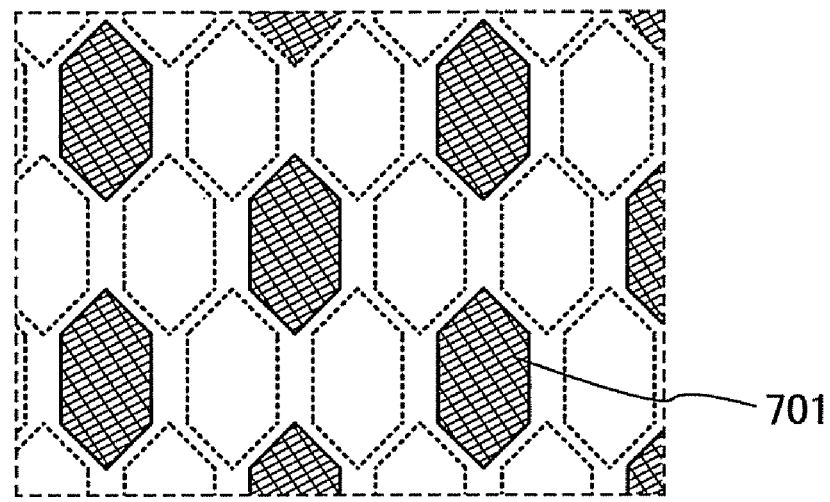

Similarly, there is no particular limitation on the arrangement of the pixels. The shape of each pixel may be a polygon, for example, a hexagon as illustrated in FIG. 7A, and a full-color light-emitting device may be realized by arrangement of an EL layer (R) 711, an EL layer (G) 712, and an EL layer (B) 713. In order to form a polygonal pixel illustrated in FIG. 7A, deposition may be performed using the first substrate illustrated in FIG. 7B, which is provided with the material layer (R) which is patterned at a position overlapping with a function layer 701 whose shape is a polygon.

Furthermore, in manufacture of a light-emitting device capable of full-color display described in Embodiment 5, a minute pattern can be formed with high accuracy by the deposition method using the evaporation donor substrate of the present invention. Accordingly, a light-emitting device with high definition can be obtained, and further the characteristics of the light-emitting device can be improved. Further, the evaporation material which becomes unnecessary in patterning the material layer can be reused by being collected; therefore, manufacturing cost of a light-emitting device can be reduced.

Note that the structure shown in Embodiment 4 can be combined with any of the structures shown in Embodiments 1 to 3 as appropriate.

(Embodiment 5)

In this embodiment, methods for manufacturing a light-emitting element and a light-emitting device are described as an embodiment of the present invention.

Figure 8A:
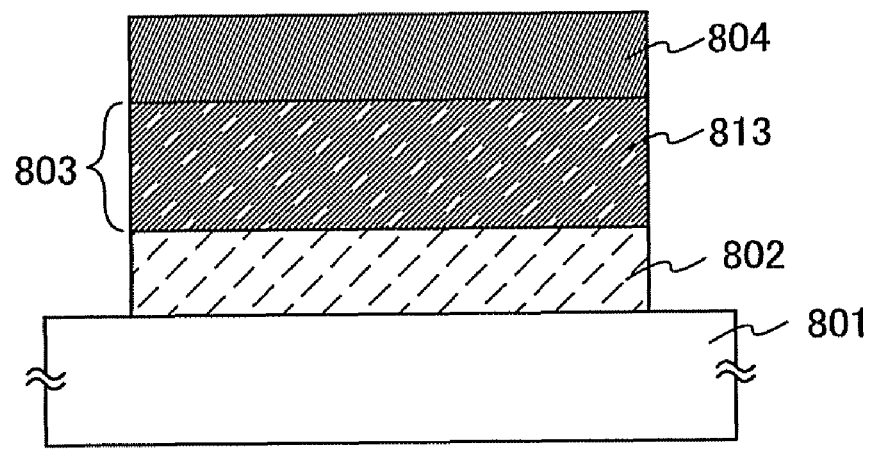
FIGS. 8A and 8B are diagrams each illustrating a light-emitting element.
Figure 8B:
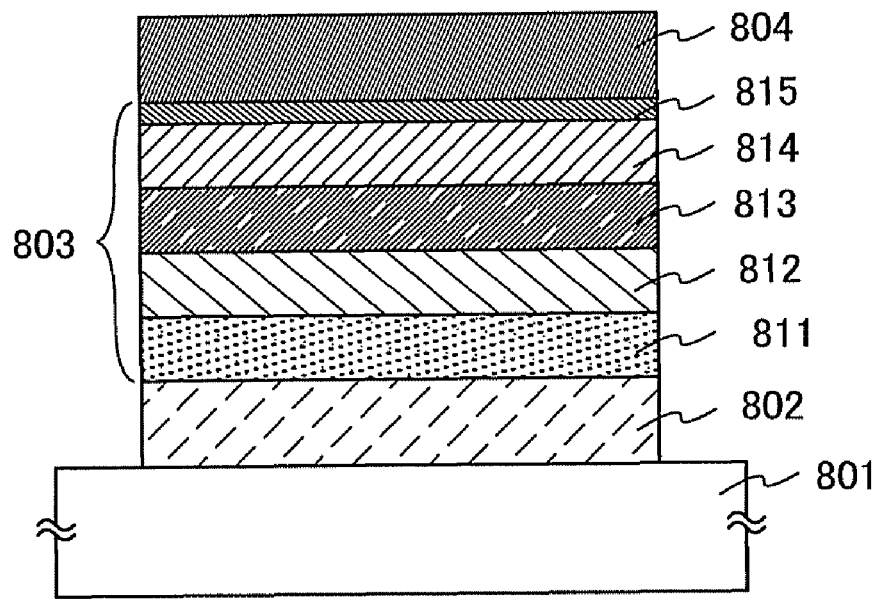

For example, light-emitting elements illustrated in FIGS. 8A and 8B can be manufactured. In the light-emitting element illustrated in FIG. 8A, a first electrode 802, an EL layer 803 which includes only a light-emitting layer 813, and a second electrode 804 are stacked in this order over a substrate 801. One of the first electrode 802 and the second electrode 804 functions as an anode, and the other functions as a cathode. Holes injected from an anode and electrons injected from a cathode are recombined in the EL layer 803, whereby light emission can be obtained. In this embodiment, the first electrode 802 functions as an anode and the second electrode 804 functions as a cathode.

In the light-emitting element illustrated in FIG. 8B, the EL layer 803 in FIG. 8A has a structure in which a plurality of layers are stacked. Specifically, a hole-injecting layer 811, a hole-transporting layer 812, the light-emitting layer 813, an electron-transporting layer 814, and an electron-injecting layer 815 are provided in this order from the first electrode 802 side. Note that the EL layer 803 functions by including at least the light-emitting layer 813 as illustrated in FIG. 8A; thus, not all the above-described layers are needed and the layer to be provided may be selected as appropriate.

As the substrate 801 illustrated in FIGS. 8A and 8B, a substrate having an insulating surface or an insulating substrate is employed. Specifically, any of a variety of glass substrates made of glass used for the electronics industry, such as aluminosilicate glass, aluminoborosilicate glass, or barium borosilicate glass; a quartz substrate; a ceramic substrate; a sapphire substrate; or the like can be used.

For the first electrode 802 and the second electrode 804, any of various types of metals, alloys, electrically conductive compounds, a mixture thereof, and the like can be used. Specific examples are given below: indium tin oxide (ITO), indium tin oxide containing silicon or silicon oxide, indium zinc oxide (IZO), and indium oxide containing tungsten oxide and zinc oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride: TiN), or the like can be given.

These materials are usually formed by a sputtering method. For example, a film of indium zinc oxide can be formed by a sputtering method using a target in which zinc oxide is added to indium oxide at 1 to 20 wt %. A film of indium oxide containing tungsten oxide and zinc oxide can be formed by a sputtering method using a target in which tungsten oxide and zinc oxide are added to indium oxide at 0.5 to 5 wt % and 0.1 to 1 wt %, respectively. Alternatively, by application of a sol-gel method or the like, an inkjet method, a spin coating method, or the like may be used for the formation.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like.

A film of an alkali metal, an alkaline earth metal, or an alloy thereof can be formed by a vacuum evaporation method. In addition, an alloy including an alkali metal or an alkaline earth metal can be formed by a sputtering method. Further, a film can be formed using a silver paste or the like by an inkjet method or the like. Each of the first electrode 802 and the second electrode 804 is not limited to a single-layer film and can be formed as a stacked-layer film.

Note that in order to extract light emitted from the EL layer 803 to the outside, one or both of the first electrode 802 and the second electrode 804 is/are formed so as to transmit light. For example, one or both of the first electrode 802 and the second electrode 804 is/are formed using a conductive material having a light-transmitting property, such as indium tin oxide, or formed using silver, aluminum, or the like to have a thickness of several nanometers to several tens of nanometers. Alternatively, one or both of the first electrode 802 and the second electrode 804 can have a stacked-layer structure including a thin film of a metal such as silver, aluminum, or the like with a small thickness and a thin film of a conductive material having a light-transmitting property, such as ITO.

Note that the EL layer 803 (the hole-injecting layer 811, the hole-transporting layer 812, the light-emitting layer 813, the electron-transporting layer 814, or the electron-injecting layer 815) of the light-emitting element described in this embodiment can be formed by application of the deposition method described in any of Embodiments 1 to 4.

For example, in the case where the light-emitting element illustrated in FIG. 8A is formed, a material layer of the evaporation donor substrate described in Embodiment 1 is formed of a material which forms the EL layer 803, and the EL layer 803 is formed over the first electrode 802 over the substrate 801 using the evaporation donor substrate. Then, the second electrode 804 is formed over the EL layer 803, whereby the light-emitting element illustrated in FIG. 8A can be obtained.

Any of a variety of materials can be used for the light-emitting layer 813. For example, a fluorescent compound which exhibits fluorescence or a phosphorescent compound which exhibits phosphorescence can be used.

As a phosphorescent compound which can be used for the light-emitting layer 813, the following light-emitting material can be given. For example, as a blue light-emitting material, bis[2-(4',6'-difluorophenyl)pyridinato-N,$C^{2'}$]iridium(III)tetrakis(1-pyrazolyl)borate (abbreviation: FIr6); bis[2-(4',6'-difluorophenyl)pyridinato-N,$C^{2'}$]iridium(III)picolinate (abbreviation: FIrpic); bis[2-(3',5'-bistrifluoromethylphenyl)pyridinato-N,$C^{2'}$]iridium(III) picolinate (abbreviation: Ir(CF$_3$ppy)$_2$(pic)); bis[2-(4',6'-difluorophenyl)pyridinato-N,$C^{2'}$]iridium(III)acetylacetonate (abbreviation: FIracac); and the like can be given. As a green light-emitting material, tris(2-phenylpyridinato-N,$C^{2'}$)iridium(III) (abbreviation: Ir(ppy)$_3$); bis(2-phenylpyridinato-N,$C^{2'}$)iridium(III)acetylacetonate (abbreviation: Ir(ppy)$_2$(acac)); bis(1,2-diphenyl-1H-benzimidazolato)iridium(III) acetylacetonate (abbreviation: Ir(pbi)$_2$(acac)); bis(benzo[h]quinolinato)iridium(III)acetylacetonate (abbreviation: Ir(bzq)$_2$(acac)); and the like can be given. As a yellow light-emitting material, bis(2,4-diphenyl-1,3-oxazolato-N,$C^{2'}$)iridium(III)acetylacetonate (abbreviation: Ir(dpo)$_2$(acac)); bis[2-(4'-perfluorophenylphenyl)pyridinato]iridium(III) acetylacetonate (abbreviation: Ir(p-PF-ph)$_2$(acac)); bis(2-phenylbenzothiazolato-N,$C^{2'}$)iridium(III)acetylacetonate (abbreviation: Ir(bt)$_2$(acac)); and the like can be given. As an orange light-emitting material, tris(2-phenylquinolinato-N,$C^{2'}$)iridium(III) (abbreviation: Ir(pq)$_3$); bis(2-phenylquinolinato-N,$C^{2'}$)iridium(III)acetylacetonate (abbreviation: Ir(pq)$_2$(acac)); and the like can be given. As a red light-emitting material, an organometallic complex such as bis[2-(2'-benzo[4,5-α]thienyl)pyridinato-N,$C^{3'}$)iridium(III)acetylacetonate (abbreviation: Ir(btp)$_2$(acac)); bis(1-phenylisoquinolinato-N,$C^{2'}$)iridium(III)acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); 2,3,7,8,12,13,17,18-octaethyl-21H,23H-porphyrinplatinum(II) (abbreviation: PtOEP); and the like can be given. In addition, a rare-earth metal complex such as tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); and tris[1-(2-thenoyl)-3,3,3-trifluoroacetonato](monophenanthroline)europium(III) (abbreviation: Eu(TTA)$_3$(Phen)) perform light emission (electron transition between different multiplicities) from a rare-earth metal ion; therefore, such a rare-earth metal complex can be used as the phosphorescent compound.

As a fluorescent compound which can be used for the light-emitting layer 813, the following light-emitting material can be given. For example, as a blue light-emitting material, N,N'-bis[4-(9H-carbazol-9-yl)phenyl]-N,N'-diphenyl-stilbene-4,4'-diamine (abbreviation: YGA2S); 4-(9H-carbazol-9-yl)-4'-(10-phenyl-9-anthryl)triphenylamine (abbreviation: YGAPA); and the like can be given. As a green light-emitting material, N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); and the like can be given. As a yellow light-emitting material, rubrene; 5,12-bis(1,1'-biphenyl-4-yl)-6,11-diphenyltetracene (abbreviation: BPT); and the like can be given. As a red light-emitting material, N,N,N',N'-tetrakis(4-methylphenyl)tetracene-5,11-diamine (abbreviation: p-mPhTD); 7,13-diphenyl-N,N,N',N'-tetrakis(4-methylphenyl)acenaphtho[1,2-a]fluoranthene-3,10-diamine (abbreviation: p-mPhAFD), and the like can be given.

Alternatively, the light-emitting layer 813 can have a structure in which a substance having a high light-emitting property (a dopant material) is dispersed in another substance (a host material). The structure in which a substance having a high light-emitting property (a dopant material) is dispersed in another substance (a host material) is used for the light-emitting layer, whereby crystallization of the light-emitting layer can be controlled. Further, concentration quenching due to high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

As the host material used for the light-emitting layer 813, for example, 4,4'-di(9-carbazolyl)biphenyl (CBP); 2-tert-butyl-9,10-di(2-naphthyl)anthracene (t-BuDNA); 9-[4-(9-carbazolyl)phenyl]-10-phenylanthracene (CzPA); and the like as well as 4,4'-bis[N-(1-naphthyl)-N-phenylamino]biphenyl (NPB); tris(8-quinolinolato)aluminum(III) (Alq); 4,4'-bis[N-(9,9-dimethylfluoren-2-yl)-N-phenylamino]biphenyl (DFLDPBi); bis(2-methyl-8-quinolinolato)(4-phenylphenolato)aluminum(III) (BAlq); and the like can be given.

As the dopant material, any of the above-mentioned phosphorescent compounds and fluorescent compounds can be used.

In the case where the light-emitting layer 813 has a structure in which a substance having a high light-emitting property (a dopant material) is dispersed in another substance (a host material), a mixed layer of a host material and a guest material is formed as the material layer over the evaporation donor substrate. Alternatively, the material layer over the evaporation donor substrate may have a structure in which a layer containing a host material and a layer containing a dopant material are stacked. Formation of the light-emitting layer 813 by use of an evaporation donor substrate with the material layer having such a structure, the light-emitting layer 813 contains a substance in which a light-emitting material is dispersed (a host material) and a substance having a high light-emitting property (a dopant material), and has a structure in which the substance having a high light-emitting property (a dopant material) is dispersed in the substance in which a light-emitting material is dispersed (a host material). Note that for the light-emitting layer 813, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 8B is formed, the evaporation donor substrate described in Embodiment 1 which has a material layer formed of a material for forming each layer in the EL layer 803 (the hole-injecting layer 811, the hole-transporting layer 812, the electron-transporting layer 814, and the electron-injecting layer 815) is prepared for each layer, and deposition of each layer is performed using a different evaporation donor substrate by the method described in Embodiment 1, whereby the EL layer 803 is formed over the first electrode 802 over the substrate 801. Then, the second electrode 804 is formed over the EL layer 803; thus, the light-emitting element illustrated in FIG. 8B can be obtained. Note that although all the layers in the EL layer 803 can be formed by the method described in Embodiment 1 in this case, only some of the layers in the EL layer 803 may be formed by the method described in Embodiment 1.

For example, the hole-injecting layer 811 can be formed using molybdenum oxide, vanadium oxide, ruthenium oxide, tungsten oxide, manganese oxide, or the like. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesufonic acid) (PEDOT/PSS), or the like to form the hole-injecting layer.

As the hole-injecting layer 811, a layer which contains a substance having a high hole-transporting property and a substance having an electron-accepting property can be used. The layer containing a substance having a high hole-transporting property and a substance having an electron-accepting property has a high carrier density and an excellent hole-injecting property. In addition, the layer containing a substance having a high hole-transporting property and a substance having an electron-accepting property is used as a hole-injecting layer which is in contact with an electrode which functions as an anode, whereby various kinds of metals, alloys, electrically conductive compounds, mixtures thereof, or the like can be used for the electrode regardless of the work function of a material of the electrode which functions as an anode.

The layer which contains a substance having a high hole-transporting property and a substance having an electron-accepting property can be formed using, for example, an evaporation donor substrate having a material layer which is a stack of a layer containing a substance having a high hole-transporting property and a layer containing a substance having an electron-accepting property.

As the substance having an electron-accepting property, which is used for the hole-injecting layer 811, 7,7,8,8-tetracyano-2,3,5,6-tetrafluoroquinodimethane ($F_4$-TCNQ), chloranil, and the like can be given. In addition, a transition metal oxide can be given. Still other examples are oxide of metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable because it is stable in the air and its hygroscopic property is low so that and it can be easily handled.

As the substance having a high hole-transporting property used for the hole-injecting layer 811, any of various compounds such as an aromatic amine compound, a carbazole derivative, an aromatic hydrocarbon, and a high molecular compound (such as oligomer, dendrimer, and polymer) can be used. A substance which has a hole mobility of greater than or equal to $10^{-6}$ cm$^2$/Vs is preferably used as a substance having a high hole-transporting property which is used for the hole-injecting layer. However, other substances may also be used as long as the hole-transporting properties thereof are higher than the electron-transporting properties thereof. Specific examples of the substance having a high hole-transporting property, which can be used for the hole-injecting layer 811, are given below.

As the aromatic amine compound which can be used for the hole-injecting layer 811, for example, the following can be used: 4,4'-bis[N-(1-naphthyl)-N-phenylamino]biphenyl (abbreviation: NPB); N,N'-bis(3-methylphenyl)-N,N'-diphenyl-[1,1'-biphenyl]-4,4'-diamine (abbreviation: TPD); 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); 4,4'-bis[N-(spiro-9,9'-bifluoren-2-yl)-N-phenylamino]biphenyl (abbreviation: BSPB); and the like. In addition, the following can be given: N,N'-bis(4-methylphenyl)(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As the carbazole derivative which can be used for the hole-injecting layer 811, the following can be specifically given: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

In addition, as the carbazole derivative which can be used for the hole-injecting layer 811, the following can be given: 4,4'-di(N-carbazolyl)biphenyl (abbreviation: CBP); 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene; and the like.

As the aromatic hydrocarbon which can be used for the hole-injecting layer 811, the following can be given, for example: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. In addition, pentacene, coronene, or the like can also be used. As described above, an aromatic hydrocarbon which has a hole mobility of greater than or equal to $1 \times 10^{-6}$ cm$^2$/Vs and which has 14 to 42 carbon atoms is more preferable.

The aromatic hydrocarbon which can be used for the hole-injecting layer 811 may have a vinyl skeleton. As an aromatic hydrocarbon having a vinyl group, for example, 4,4'-bis(2,2-diphenylvinyl)biphenyl (abbreviation: DPVBi); 9,10-bis[4-(2,2-diphenylvinyl)phenyl]anthracene (abbreviation: DPVPA); and the like can be given.

The hole-injecting layer 811 can be formed using an evaporation donor substrate having a material layer in which a layer containing the above-described substance having a high hole-transporting property and a layer containing the above-described substance having an electron-accepting property are stacked. In the case of using metal oxide as the substance having an electron-accepting property, it is preferable that a layer containing metal oxide be formed after forming the layer containing a substance having a high hole-transporting property over the substrate 801. This is because, in many cases, metal oxide has a higher decomposition temperature or an evaporation temperature than a substance having a high hole-transporting property. The evaporation source with such a structure makes it possible to efficiently sublimate a substance having a high hole-transporting property and metal oxide. In addition, local non-uniformity of the concentration in a film formed by evaporation can be suppressed. Moreover, there are few kinds of solvents which dissolve or disperse both a substance having a high hole-transporting property and metal oxide, and a mixed solution is not easily formed. Therefore, it is difficult to directly form a mixed layer by a wet method. However, the use of the deposition method of the present invention makes it possible to easily form a mixed layer which contains a substance having a high hole-transporting property and a metal oxide.

Moreover, the layer which contains a substance having a high hole-transporting property and a substance having an electron-accepting property has not only an excellent hole-injecting property but also an excellent hole-transporting property; thus, the above-described hole-injecting layer 811 may be used as a hole-transporting layer.

The hole-transporting layer 812 contains a substance having a high hole-transporting property. As the substance having a high hole-transporting property, the following can be used, for example: an aromatic amine compound such as 4,4'-bis[N-(1-naphthyl)-N-phenylamino]biphenyl (abbreviation: NPB or α-NPD); N,N'-bis(3-methylphenyl)-N,N'-diphenyl-[1,1'-biphenyl]-4,4'-diamine (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); or 4,4'-bis[N-(spiro-9,9'-bifluoren-2-yl)-N-phenylamino]biphenyl (abbreviation: BSPB). The substances mentioned here mainly have a hole mobility of greater than or equal to $10^{-6}$ cm$^2$/Vs. However, other substances may also be used as long as the hole-transporting properties thereof are higher than the electron-transporting properties thereof. Note that the layer containing a substance having a high hole-transporting property is not limited to a single layer, and may be a stack of two or more layers each formed of the aforementioned substance.

The electron-transporting layer 814 contains a substance having a high electron-transporting property. As the substance having a high electron-transporting property, for example, a metal complex having a quinoline skeleton or a benzoquinoline skeleton, such as tris(8-quinolinolato)aluminum (abbreviation: Alq); tris(4-methyl-8-quinolinolato)aluminum (abbreviation: Almq$_3$); bis(10-hydroxybenzo[h]quinolinato)beryllium (abbreviation: BeBq$_2$); or bis(2-methyl-8-quinolinolato)(4-phenylphenolato)aluminum (abbreviation: BAlq) can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ01); bathophenanthroline (abbreviation: BPhen); bathocuproine (abbreviation: BCP); or the like can also be used. The substances mentioned here mainly have an electron mobility of greater than or equal to $10^{-6}$ cm$^2$/Vs. Note that other substances than the substances mentioned above may also be used for the electron-transporting layer as long as the electron-transporting properties thereof are higher than the hole-transporting properties thereof. Further, the electron-transporting layer is not limited to a single layer, and may be a stack of two or more layers each formed of the aforementioned substance.

As the electron-injecting layer 815, a compound of an alkali metal or an alkaline earth metal such as lithium fluoride (LiF), cesium fluoride (CsF), or calcium fluoride (CaF$_2$) can be used. Furthermore, a layer, in which a substance having an electron-transporting property is combined with an alkali metal or an alkaline earth metal, can be used. For example, Alq including magnesium (Mg) can be used. Note that it is preferable that the layer in which a substance having an electron-transporting property is combined with an alkali metal or an alkaline earth metal be used as the electron-injecting layer because electrons are efficiently injected from the second electrode 804.

Note that there is no particular limitation on the stacked structure of the EL layer 803, and the EL layer 803 may be formed by an appropriate combination of a light-emitting layer with a layer formed of a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

Light emission from the EL layer 803 is extracted to the outside through one or both of the first electrode 802 and the second electrode 804. Therefore, one or both of the first electrode 802 and the second electrode 804 is/are an electrode having a light-transmitting property. When only the first electrode 802 is an electrode having a light-transmitting property, light is extracted from the substrate 801 side through the first electrode 802. When only the second electrode 804 is an electrode having a light-transmitting property, light is extracted from a side opposite to the substrate 801 through the second electrode 804. When both the first electrode 802 and the second electrode 804 are electrodes having light-transmitting properties, light is extracted from both the substrate 801 side and the side opposite thereto through the first electrode 802 and the second electrode 804, respectively.

Although FIGS. 8A and 8B illustrate the structure in which the first electrode 802 which functions as an anode is provided on the substrate 801 side, the second electrode 804 which functions as a cathode may be provided on the substrate 801 side.

The EL layer 803 is formed by any of the deposition methods described in Embodiments 1 to 4 or may be formed by a combination of any of the deposition methods described in Embodiments 1 to 4 with another deposition method. Further, each electrode and each layer may be formed by different deposition methods. Examples of a dry method include a vacuum evaporation method, an electron beam evaporation method, a sputtering method, and the like. Examples of a wet method include an inkjet method, a spin coating method, and the like.

In a light-emitting element according to Embodiment 5, an EL layer can be formed by application of an evaporation donor substrate which is an embodiment of the present invention. Accordingly, a film can be efficiently formed with high accuracy. Therefore, not only improvement in characteristics of the light-emitting element, but also improvement in yield and a reduction in cost can be achieved.

(Embodiment 6)

In Embodiment 6, a light-emitting device formed using a light-emitting element which is an embodiment of the present invention is described.

First, a passive-matrix light-emitting device will be described with reference to FIGS. 9A to 9C and FIG. 10.

In a passive-matrix (also referred to as simple-matrix) light-emitting device, a plurality of anodes arranged in stripes (in strip form) are provided to be perpendicular to a plurality of cathodes arranged in stripes. A light-emitting layer is interposed at each intersection. Therefore, a pixel at an intersection of a selected anode (to which voltage is applied) and a selected cathode emits light.

Figure 9A:
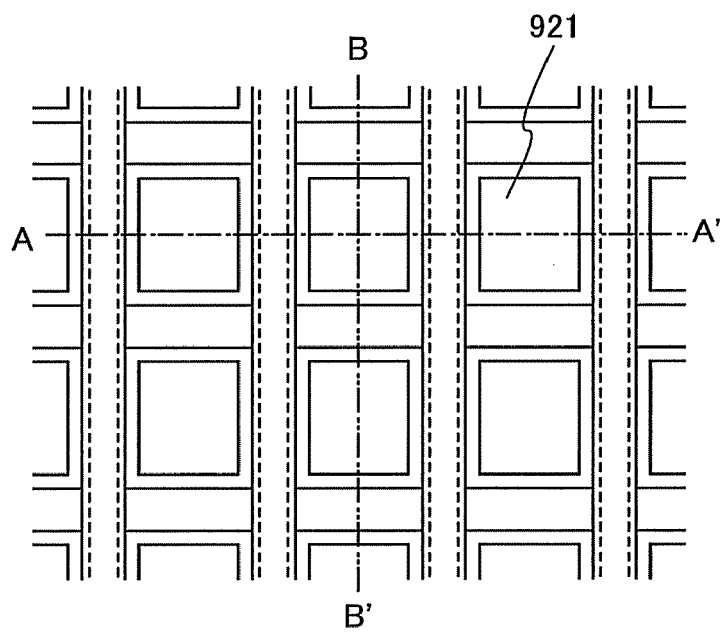
FIGS. 9A to 9C are diagrams illustrating a passive-matrix light-emitting device.
Figure 9C:
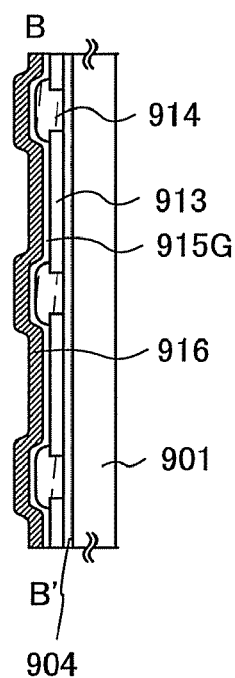
Figure 9B:
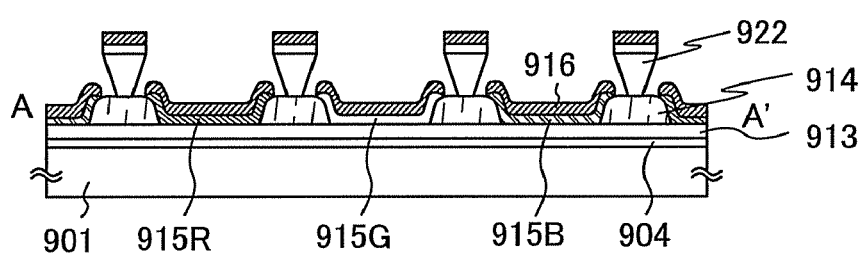

FIG. 9A is a top view of a pixel portion before sealing. FIG. 9B is a cross-sectional view taken along a chain line A-A' in FIG. 9A. FIG. 9C is a cross-sectional view taken along a chain line B-B' in FIG. 9A.

Over a substrate 901, an insulating layer 904 is formed as a base insulating layer. Note that the base insulating layer is not necessarily formed if not necessary. Over the insulating layer 904, a plurality of first electrodes 913 are arranged in stripes at regular intervals. A partition wall 914 having opening portions each corresponding to a pixel is provided over the first electrodes 913. The partition wall 914 having opening portions is formed using an insulating material (a photosensitive or a nonphotosensitive organic material (e.g., polyimide, acrylic, polyamide, polyimide amide, resist, or benzocyclobutene) or an SOG film (e.g., a SiOx film containing an alkyl group)). Note that the opening portions each corresponding to a pixel serve as light-emitting regions 921.

Over the partition wall 914 having opening portions, a plurality of inversely-tapered partition walls 922 parallel to each other are provided to intersect with the first electrodes 913. The inversely-tapered partition walls 922 are formed by a photolithography method using a positive-type photosensitive resin of which a portion unexposed to light remains as a pattern, and by adjustment of the amount of light exposure or the length of development time so that a lower part of a pattern is etched more.

The total thickness of the partition wall 914 having opening portions and each of the inversely-tapered partition walls 922 is set to be larger than the total thickness of an EL layer and each of second electrodes 916. Accordingly, an EL layer which is divided into plural regions, specifically, an EL layer (R) (915R) formed of a material for red emission, an EL layer (G) (915G) formed of a material for green emission, and an EL layer (B) (915B) formed of a material for blue emission; and the second electrodes 916 are formed. Note that the plurality of separated regions is electrically isolated from one another.

The second electrodes 916 are electrodes in stripes, which are parallel to one another and extend in a direction intersecting with the first electrodes 913. Note that the EL layer and a part of a conductive layer for forming the second electrodes 916 are also formed over the inversely-tapered partition walls 922; however, they are separated from the EL layer (R) (915R), the EL layer (G) (915G), the EL layer (B) (915B), and the second electrodes 916. Note that the EL layer in this embodiment is a layer including at least a light-emitting layer and may include a hole-injecting layer, a hole-transporting layer, an electron-transporting layer, an electron-injecting layer, or the like in addition to the light-emitting layer.

Here, an example is described in which the EL layer (R) (915R), the EL layer (G) (915G), and the EL layer (B) (915B) are selectively formed to manufacture a light-emitting device which provides three kinds of light emission (red (R), green (G), blue (B)) and is capable of performing full-color display. Note that the EL layer (R) (915R), the EL layer (G) (915G), and the EL layer (B) (915B) are formed into stripes parallel to one another. These EL layers may be formed by any of the deposition methods described in Embodiments 1 to 4.

Further, sealing is performed using a sealing material such as a sealant can or a glass substrate for sealing, if necessary. Here, a glass substrate is used as a sealing substrate, and a substrate and the sealing substrate are attached to each other with an adhesive material such as a sealing material to seal a space surrounded by the adhesive material such as a sealing material. The space that is sealed is filled with a filler or a dried inert gas. In addition, a desiccant agent or the like may be put between the substrate and the sealing material so that reliability of the light-emitting device is increased. The desiccant agent removes a minute amount of moisture for sufficient desiccation. For the desiccant agent, a substance that adsorbs moisture by chemical adsorption such as oxide of alkaline earth metal such as calcium oxide or barium oxide can be used. In addition, a substance that adsorbs moisture by physical adsorption such as zeolite or silicagel may be used.

The desiccant agent is not necessarily provided if the sealing material that covers and is contact with the light-emitting element is provided to sufficiently block the outside air.

Figure 10:
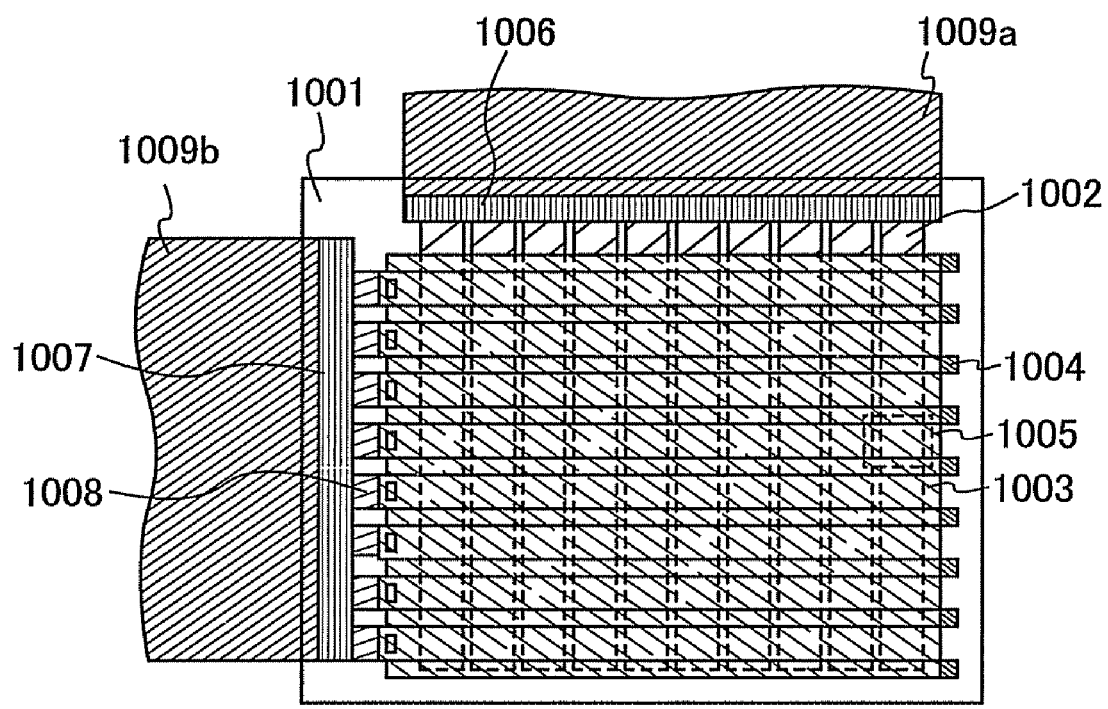
FIG. 10 is a diagram illustrating a passive-matrix light-emitting device.

Next, FIG. 10 is a top view of the case where the passive-matrix light-emitting device illustrated in FIGS. 9A to 9C is mounted with an FPC or the like.

In FIG. 10, in a pixel portion forming an image display, scanning lines and data lines are arranged to intersect with each other so that the scanning lines and the data lines are perpendicular to each other.

Here, the first electrodes 913 in FIGS. 9A to 9C correspond to scanning lines 1003 in FIG. 10; the second electrodes 916 in FIGS. 9A to 9C correspond to data lines 1002 in FIG. 10; and the inversely-tapered partition walls 922 correspond to partition walls 1004. EL layers are sandwiched between the data lines 1002 and the scanning lines 1003, and an intersection portion indicated by a region 1005 corresponds to one pixel.

Note that the scanning lines 1003 are electrically connected at their ends to connecting wirings 1008, and the connecting wirings 1008 are connected to an FPC 1009b via an input terminal 1007. The data lines are connected to an FPC 1009a via an input terminal 1006.

In addition, an optical film such as a polarizing plate, a circularly polarizing light plate (including an elliptically polarizing plate), a retardation plate (a λ/4 plate or a λ/2 plate), or a color filter may be provided as appropriate on the light-emission surface. Further, the polarizing plate or the circularly polarizing plate may be provided with an anti-reflection film. For example, an anti-glare treatment which can diffuse reflected light in the depression/projection of the surface, and reduce glare can be performed.

Although FIG. 10 illustrates the example in which a driver circuit is not provided over the substrate, the present invention is not particularly limited to this example. An IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. As an alternative mounting technique to the COG bonding, TCP or wire bonding may be used. TCP is a TAB tape on which an IC is mounted, and the IC is mounted by connecting the TAB tape to wires on the element forming substrate. Each of the data line side IC and the scanning line side IC may be formed using a silicon substrate. Alternatively, it may be formed in such a manner that a driver circuit is formed using a TFT over a glass substrate, a quartz substrate, or a plastic substrate. In addition, although described here is an example in which a single IC is provided on one side, a plurality of ICs may be provided on one side.

Figure 11A:
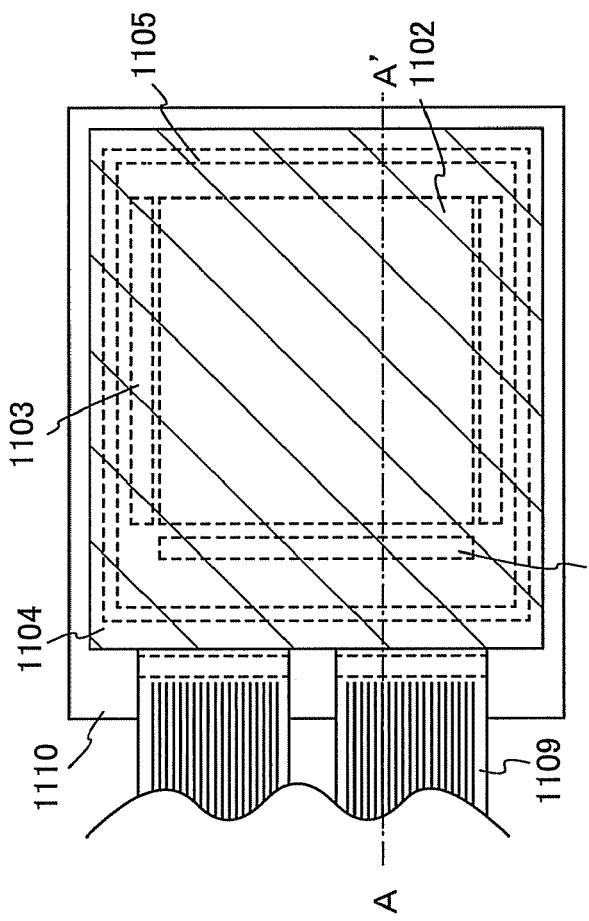
FIGS. 11A and 11B are diagrams illustrating an active-matrix light-emitting device.
Figure 11B:
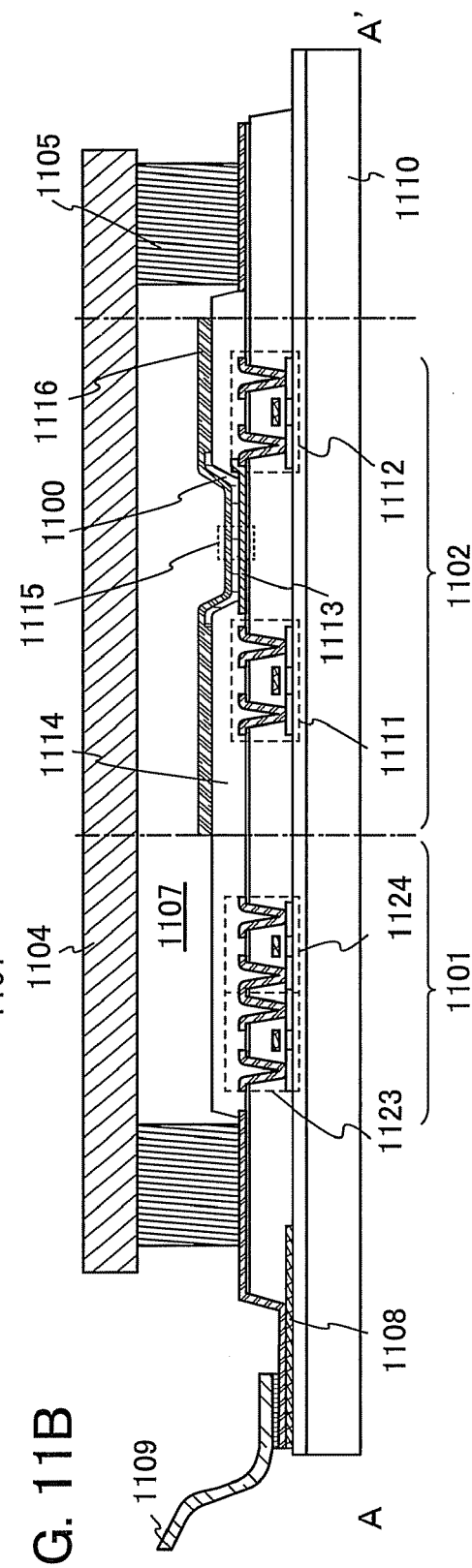

Next, an example of an active-matrix light-emitting device is described with reference to FIGS. 11A and 11B. Note that FIG. 11A is a top view illustrating a light-emitting device and FIG. 11B is a cross-sectional view taken along a chain line A-A' in FIG. 11A. The active-matrix light-emitting device according to this embodiment includes a pixel portion 1102 provided over an element substrate 1110, a driver circuit portion (a source side driver circuit) 1101, and a driver circuit portion (a gate side driver circuit) 1103. The pixel portion 1102, the driver circuit portion 1101, and the driver circuit portion 1103 are sealed, with a sealing material 1105, between the element substrate 1110 and a sealing substrate 1104.

In addition, over the element substrate 1110, a lead wiring 1108 for connecting an external input terminal which transmits a signal (e.g., a video signal, a clock signal, a start signal, or a reset signal) or an electric potential to the driver circuit portion 1101 and the driver circuit portion 1103 is provided. Here, an example is described in which a flexible printed circuit (FPC) 1109 is provided as the external input terminal. Although only the FPC is shown here, this FPC may be provided with a printed wiring board (PWB). The light-emitting device in this specification includes not only a light-emitting device body but also a state in which an FPC or a PWB is attached thereto.

A cross-sectional structure thereof is described with reference to FIG. 11B. The driver circuit portions and the pixel portion are formed over the element substrate 1110; however, the pixel portion 1102 and the driver circuit portion 1101 which is the source side driver circuit are illustrated in FIG. 11B.

An example is illustrated in which a CMOS circuit which is the combination of an n-channel TFT 1123 and a p-channel TFT 1124 is formed in the driver circuit portion 1101. Note that a circuit included in the driver circuit portion may be formed of various CMOS circuits, PMOS circuits, or NMOS circuits. Although a driver-integrated type where the driver circuit is formed over the substrate is described in this embodiment, an embodiment of the present invention is not limited to this structure, and the driver circuit may be formed outside the substrate, not over the substrate.

The pixel portion 1102 includes a plurality of pixels, each of which includes a switching TFT 1111, a current-controlling TFT 1112, and a first electrode 1113 which is electrically connected to a wiring (a source electrode or a drain electrode) of the current-controlling TFT 1112. Note that an insulator 1114 is formed so as to cover an end portion of the first electrode 1113. In this embodiment, the insulator 1114 is formed using a positive photosensitive acrylic resin.

The insulator 1114 is preferably formed so as to have a curved surface with curvature at an upper end portion or a lower end portion thereof in order to obtain favorable coverage by a film which is to be stacked over the insulator 1114. For example, in the case of using a positive photosensitive acrylic resin as a material for the insulator 1114, the insulator 1114 is preferably formed so as to have a curved surface with a curvature radius (0.2 μm to 3 μm) at the upper end portion thereof. Either a negative photosensitive material which becomes insoluble in an etchant by light irradiation or a positive photosensitive material which becomes soluble in an etchant by light irradiation can be used for the insulator 1114. As the insulator 1114, without limitation to an organic compound, either an organic compound or an inorganic compound such as silicon oxide or silicon oxynitride can be used.

An EL layer 1100 and a second electrode 1116 are stacked over the first electrode 1113. Note that when an ITO film is used as the first electrode 1113, and a stacked film of a titanium nitride film and a film containing aluminum as its main component or a stacked film of a titanium nitride film, a film containing aluminum as its main component, and a titanium nitride film is used as a wiring of the current-controlling TFT 1112 which is connected to the first electrode 1113, resistance of the wiring is low and favorable ohmic contact with the ITO film can be obtained. Note that, although not illustrated here, the second electrode 1116 is electrically connected to the FPC 1109 which is an external input terminal.

In the EL layer 1100, at least the light-emitting layer is provided, and in addition to the light-emitting layer, a hole-injecting layer, a hole-transporting layer, an electron-transporting layer, or an electron-injecting layer is provided as appropriate. The first electrode 1113, the EL layer 1100, and the second electrode 1116 are stacked, whereby a light-emitting element 1115 is formed.

In addition, although the cross-sectional view of FIG. 11B illustrates only one light-emitting element 1115, a plurality of light-emitting elements are arranged in matrix in the pixel portion 1102. Light-emitting elements which provide three kinds of light emissions (R, G, and B) are selectively formed in the pixel portion 1102, whereby a light-emitting device which is capable of full-color display can be manufactured. Alternatively, by a combination with color filters, a light-emitting device capable of full-color display may be formed.

Furthermore, the sealing substrate 1104 and the element substrate 1110 are attached to each other with the sealing material 1105, whereby the light-emitting element 1115 is provided in a space 1107 surrounded by the element substrate 1110, the sealing substrate 1104, and the sealing material 1105. Note that the space 1107 may be filled with an inert gas (e.g., nitride or argon) or the sealing material 1105.

Note that an epoxy resin is preferably used for the sealing material 1105. In addition, it is desirable to use a material that allows permeation of moisture or oxygen as little as possible. As the sealing substrate 1104, a plastic substrate formed of FRP (fiberglass-reinforced plastics), PVF (polyvinyl fluoride), a polyester film, polyester, acrylic, or the like can be used instead of a glass substrate or a quartz substrate.

Accordingly, a light-emitting device which is an embodiment of the present invention can be obtained. An active-matrix light-emitting device tends to require high manufacturing cost per device because TFTs are manufactured; however, application of an embodiment of the present invention makes it possible to drastically reduce loss of materials in forming light-emitting elements. Thus, a reduction in manufacturing cost can be achieved.

By application of an embodiment of the present invention, an EL layer included in a light-emitting element can be easily formed and further a light-emitting device including the light-emitting element can be easily manufactured. In addition, a precise pattern can be formed; thus, a light-emitting device with high definition can be obtained.

Note that the structure shown in this embodiment can be combined with any of the structures shown in Embodiment Modes 1 to 5 as appropriate.

(Embodiment 7)

In this embodiment, with reference to FIGS. 12A to 12E, various electronic devices manufactured using a light-emitting device which is an embodiment of the present invention will be described.

Examples of electronic devices manufactured using the light-emitting device according to the present invention include a television, a camera such as a video camera or a digital camera, a goggle type display (head mounted display), a navigation system, an audio reproducing device (such as a car audio and an audio component), a notebook computer, a game machine, a portable information terminal (such as a mobile computer, a cellular phone, a portable game machine, and an electronic book reader), an image reproducing device provided with a recording medium (specifically, a device for reproducing a recording medium such as a digital video disc (DVD) and having a display device for displaying the reproduced image), lighting equipment, and the like. Specific examples of these electronic devices are shown in FIGS. 12A to 12E.

Figure 12A:
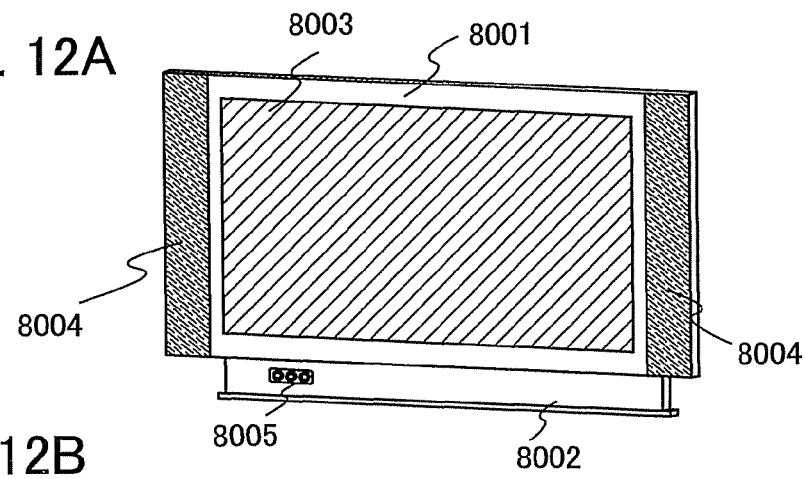
FIGS. 12A to 12E are diagrams each illustrating an electronic device.

FIG. 12A illustrates a display device including a housing 8001, a supporting base 8002, a display portion 8003, a speaker portion 8004, a video input terminal 8005, and the like. The display device is manufactured using a light-emitting device which is an embodiment of the present invention for the display portion 8003. Note that the category of the display device includes all types of information display devices, for example, display devices for a personal computer, display devices for TV broadcast reception, display devices for advertisement display, and the like. By application of a light-emitting device which is an embodiment of the present invention, deterioration of materials in deposition or the like can be prevented and patterning can be performed with high accuracy; therefore, a display device with high definition, high light-emitting characteristics, and a long lifetime can be provided.

Figure 12B:
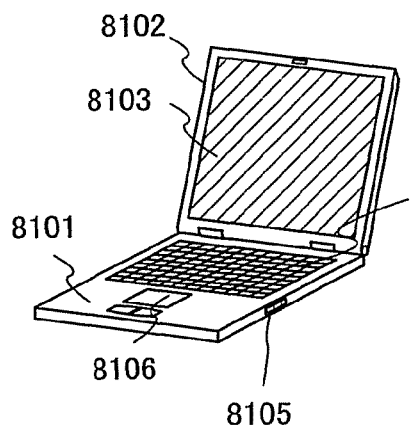

FIG. 12B illustrates a computer, which includes a main body 8101, a housing 8102, a display portion 8103, a keyboard 8104, an external connection port 8105, a pointing device 8106, and the like. Note that the computer is manufactured using a light-emitting device which is an embodiment of the present invention for the display portion 8103. By application of a light-emitting device which is an embodiment of the present invention, deterioration of materials in deposition or the like can be prevented and patterning can be performed with high accuracy; therefore, a computer provided with a display portion with high definition, high light-emitting characteristics, and a long lifetime can be provided.

Figure 12C:
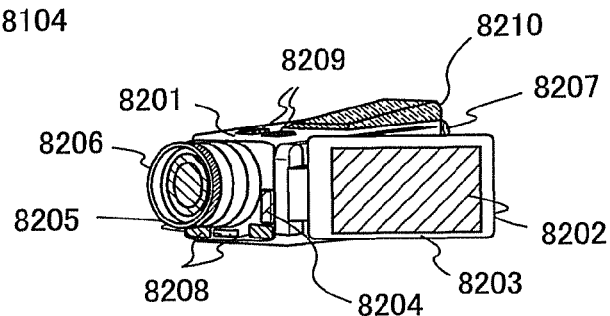

FIG. 12C illustrates a video camera, which includes a main body 8201, a display portion 8202, a housing 8203, an external connection port 8204, a remote control receiving portion 8205, an image receiving portion 8206, a battery 8207, an audio input portion 8208, operation keys 8209, an eyepiece portion 8210, and the like. Note that the video camera is manufactured using a light-emitting device which is an embodiment of the present invention for the display portion 8202. By application of a light-emitting device which is an embodiment of the present invention, deterioration of materials in deposition or the like can be prevented and patterning can be performed with high accuracy; therefore, a video camera provided with a display portion with high definition, high light-emitting characteristics, and a long lifetime can be provided.

Figure 12D:
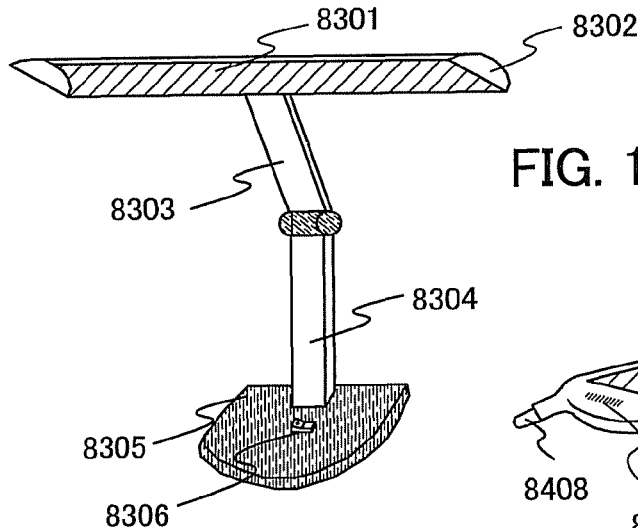

FIG. 12D illustrates desk lighting equipment, which includes a lighting portion 8301, a shade 8302, an adjustable arm 8303, a support 8304, a base 8305, and a power supply switch 8306. Note that the desk lighting equipment is manufactured using a light-emitting device which is an embodiment of the present invention for the lighting portion 8301. Note that the term 'lighting equipment' also encompasses ceiling lights, wall lights, and the like. By application of a light-emitting device which is an embodiment of the present invention, deterioration of materials in deposition or the like can be prevented and patterning can be performed with high accuracy; therefore, desk lighting equipment provided with a display portion with high definition, high light-emitting characteristics, and a long lifetime can be provided.

Figure 12E:
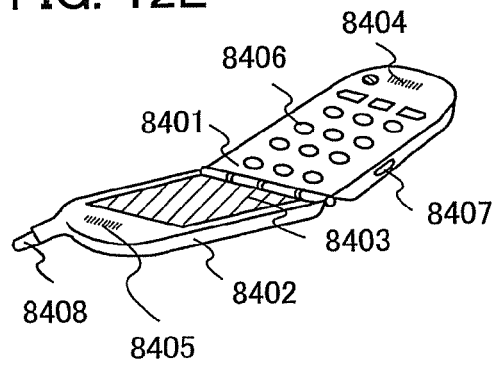

FIG. 12E illustrates a cellular phone, which includes a main body 8401, a housing 8402, a display portion 8403, an audio input portion 8404, an audio output portion 8405, operation keys 8406, an external connection port 8407, an antenna 8408, and the like. Note that the cellular phone is manufactured using a light-emitting device which is an embodiment of the present invention for the display portion 8403. By application of a light-emitting device which is an embodiment of the present invention, deterioration of materials in deposition or the like can be prevented and patterning can be performed with high accuracy; therefore, a cellular phone provided with a display portion with high definition, high light-emitting characteristics, and a long lifetime can be provided.

Figure 13A:
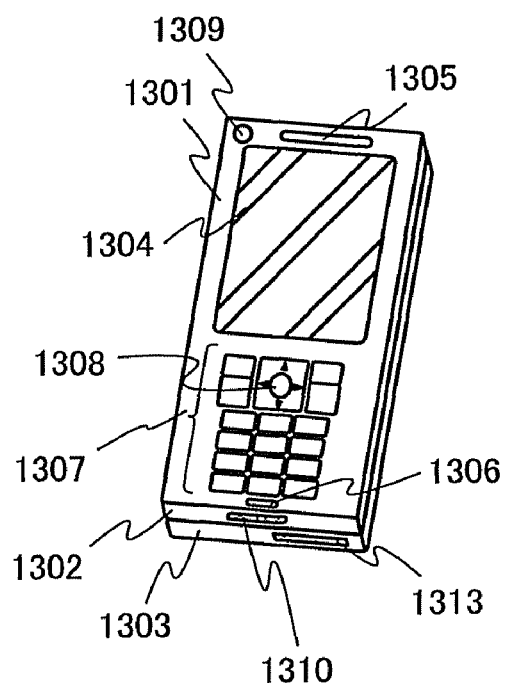
FIGS. 13A to 13C are diagrams illustrating an electronic device.
Figure 13B:
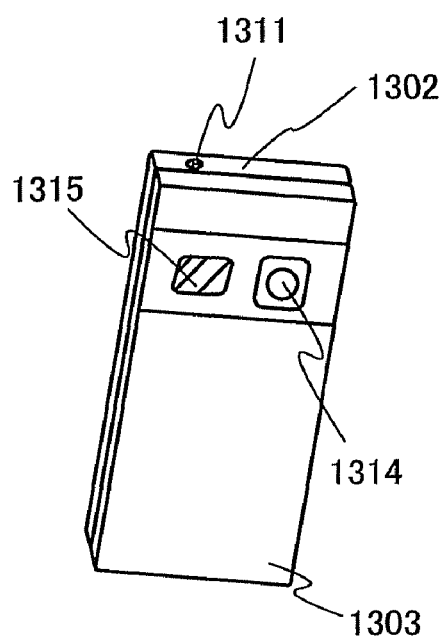
Figure 13C:
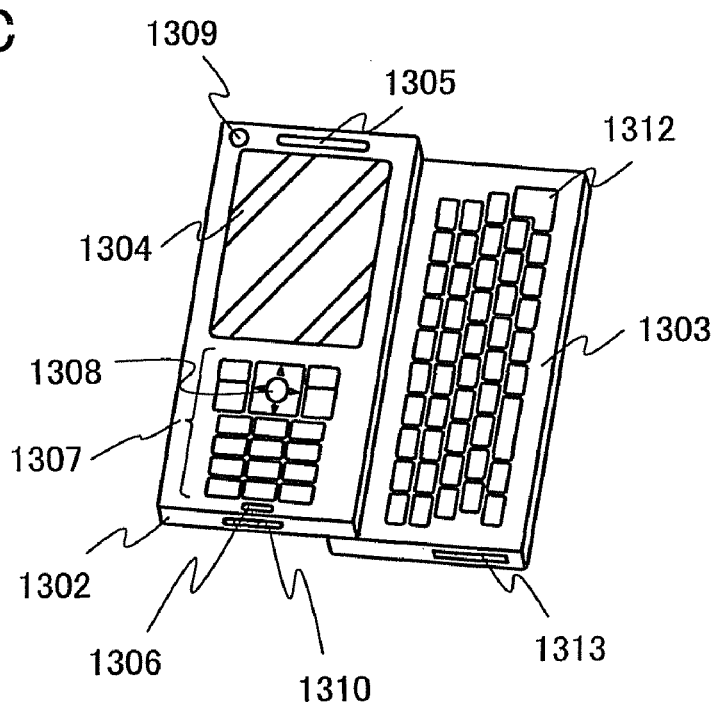

FIGS. 13A to 13C also illustrate a cellular phone. FIG. 13A is a front view, FIG. 13B is a rear view, and FIG. 13C is a development view. A main body 1301 has both functions of a cellular phone and a portable information terminal, and incorporates a computer; thus, the cellular phone is a so-called smartphone which is capable of a variety of data processing in addition to voice calls.

The main body 1301 has two housing: a housing 1302 and a housing 1303. The housing 1302 includes a display portion 1304, a speaker 1305, a microphone 1306, operation keys 1307, a pointing device 1308, a camera lens 1309, an external connection terminal 1310, an earphone terminal 1311, and the like, while the housing 1303 includes a keyboard 1312, an external memory slot 1313, a camera lens 1314, a light 1315, and the like. In addition, an antenna is incorporated in the housing 1302.

Further, in addition to the above-described structure, the smartphone may incorporate a non-contact IC chip, a small size memory device, or the like.

The display device described in any of the above embodiments can be incorporated in the display portion 1304, and display direction can be changed depending on a usage pattern. Since the camera lens 1309 is provided in the same plane as the display portion 1304, the cellular phone can be used as a videophone. Further, a still image and a moving image can be taken with the camera lens 1314 and the light 1315 using the display portion 1304 as a viewfinder. The speaker 1305 and the microphone 1306 can be used for video calls, recording and playing sound, and the like without being limited to voice calls.

The operation keys 1307 are capable of being used for incoming and outgoing calls, simple input of information such as e-mail, scroll of a screen, cursor motion, and the like. Furthermore, the housings 1302 and 1303 (FIG. 13A), which are overlapped with each other, are developed by sliding as illustrated in FIG. 13C, and can be used as a portable information terminal. In this case, smooth operation is possible with use of the keyboard 1312 and the pointing device 1308. The external connection terminal 1310 can be connected to an AC adaptor and various types of cables such as a USB cable, so that charging and data communication with a personal computer or the like are possible. Furthermore, a large amount of data can be stored and moved with a recording medium inserted into the external memory slot 1313.

In addition to the above-described functions, the smartphone may have an infrared communication function, a television receiver function, and the like.

Note that the above-described cellular phone is manufactured using a light-emitting device which is an embodiment of the present invention for the display portion 1304. By application of a light-emitting device which is an embodiment of the present invention, deterioration of materials in deposition or the like can be prevented and patterning can be performed with high accuracy; therefore, a cellular phone provided with a display portion with high definition, high light-emitting characteristics, and a long lifetime can be provided.

In the above-described manner, electronic devices or lighting equipment can be obtained by application of a light-emitting device which is an embodiment of the present invention. The light-emitting device which is an embodiment of the present invention has a remarkably wide application range, and can be applied to electronic devices in various fields.

Note that the structure shown in this embodiment can be combined with any of the structures shown in Embodiments 1 to 6 as appropriate.

This application is based on Japanese Patent Application Serial No. 2008-114975 filed with Japan Patent Office on Apr. 25, 2008, the entire contents of which are hereby incorporated by reference.

What is claimed is:

1. A method for manufacturing a light-emitting device comprising the steps of:
    forming a function layer having opening portions on one surface of a first substrate, the function layer comprising two or more first function films having a high-refractive index and two or more second function films having a low-refractive index, each of the first function films and each of the second function films being alternately stacked;
    forming a light-absorbing layer in contact with the first substrate and the function layer;
    forming a material layer in contact with the light-absorbing layer, the material layer overlapping with the opening portions of the function layer;
    removing the material layer overlapping with a portion to irradiate the light-absorbing layer with laser light having a first wavelength ($\lambda_1$) from the other surface of the first substrate, the portion overlapping with the opening portions of the function layer, wherein after irradiation with the laser light the other portion of the material layer remains, the other portion overlapping with the function layer;
    placing the one surface of the first substrate and a deposition target surface of a second substrate close to each other so that the one surface faces the deposition target surface after the removing step; and
    forming a light-emitting layer on the deposition target surface to irradiate the function layer with light having a second wavelength ($\lambda_2$) from the other surface side of the first substrate to evaporate the other portion of the material layer after the placing step,
    wherein the first wavelength ($\lambda_1$) and the second wavelength ($\lambda_2$) satisfy the following formula (1):

$\lambda_2 > 1.4\lambda_1$ or $\lambda_2 < 0.8\lambda_1$, and $\lambda_2 \neq \lambda_1/(2n+1)$ ($n$ is a natural number) (1).

wherein the refractive index of the first function films is defined as $n_1$, and the refractive index of the second function films is defined as $n_2$; and
    the thickness ($x_1$) of each of the first function films is $0.9 \times (\lambda_1/4n_1) \leq x_1 \leq 1.1 \times (\lambda_1/4n_1)$, and the thickness ($x_2$) of each of the second function films is $0.9 \times (\lambda_1/4n_2) \leq x_2 \leq 1.1 \times (\lambda_1/4n_2)$.

2. The method for manufacturing a light-emitting device according to claim 1, wherein the refractive index ($n_1$) of the first function films is greater than or equal to 2.0 and less than or equal to 3.0, and the refractive index ($n_2$) of the second function films is greater than or equal to 1.2 and less than or equal to 1.7.

3. The method for manufacturing a light-emitting device according to claim 1, wherein the first function films are formed with titanium oxide or zinc oxide and the second function films are formed with silicon oxide or magnesium fluoride.

4. The method for manufacturing a light-emitting device according to claim 1, wherein the function layer has a reflectance of greater than or equal to 70% with respect to the laser light having the wavelength $\lambda_1$.

5. The method for manufacturing a light-emitting device according to claim 1, wherein the light-absorbing layer has a reflectance of less than or equal to 70% with respect to the light having the wavelength $\lambda_1$.

6. The method for manufacturing a light-emitting device according to claim 1, wherein the light-absorbing layer includes a material selected from the group consisting of tantalum nitride, titanium nitride, chromium nitride, manganese nitride, titanium, and carbon.

7. The method for manufacturing a light-emitting device according to claim 1, wherein the material layer is formed with an organic compound.

8. The method for manufacturing a light-emitting device according to claim 1, wherein the material layer includes one or both of a light-emitting material and a carrier-transporting material.

* * * * *

UNITED STATES PATENT AND TRADEMARK OFFICE
CERTIFICATE OF CORRECTION

| | |
|---|---|
| PATENT NO. | : 8,293,319 B2 |
| APPLICATION NO. | : 12/429314 |
| DATED | : October 23, 2012 |
| INVENTOR(S) | : Ikeda et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 517 days.

Signed and Sealed this
Fifth Day of April, 2016

Michelle K. Lee
*Director of the United States Patent and Trademark Office*